US011751437B2

(12) United States Patent
Kim et al.

(10) Patent No.: US 11,751,437 B2
(45) Date of Patent: *Sep. 5, 2023

(54) ORGANIC LIGHT EMITTING DISPLAY PANEL AND ORGANIC LIGHT EMITTING DISPLAY DEVICE INCLUDING THE SAME

(71) Applicant: LG Display Co., Ltd., Seoul (KR)

(72) Inventors: Mi-Na Kim, Paju-si (KR); Namseok Yoo, Seoul (KR); JungSun Beak, Paju-si (KR); Seongjoo Lee, Paju-si (KR); Sunmi Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/675,908

(22) Filed: Feb. 18, 2022

(65) Prior Publication Data
US 2022/0173183 A1 Jun. 2, 2022

Related U.S. Application Data

(63) Continuation of application No. 16/984,959, filed on Aug. 4, 2020, now Pat. No. 11,289,557, which is a (Continued)

(30) Foreign Application Priority Data
Dec. 17, 2018 (KR) .......................... 10-2018-0163392

(51) Int. Cl.
*H10K 59/122* (2023.01)
*H10K 50/818* (2023.01)
(Continued)

(52) U.S. Cl.
CPC ......... *H10K 59/122* (2023.02); *H10K 50/818* (2023.02); *H10K 50/844* (2023.02); *H10K 59/353* (2023.02)

(58) Field of Classification Search
CPC ............. H01L 51/5209; H01L 51/5218; H01L 51/5012; H01L 51/5253; H01L 27/3246;
(Continued)

(56) References Cited

U.S. PATENT DOCUMENTS 10,373,978 B2 8/2019 Lee et al.
10,608,065 B2 3/2020 Heo
(Continued)

FOREIGN PATENT DOCUMENTS

CN 106653800 A 5/2017
CN 107342304 A 11/2017
(Continued)

OTHER PUBLICATIONS

European Patent Office, Office Action, EP Patent Application No. 19216959.7, dated Nov. 18, 2021, six pages.
(Continued)

*Primary Examiner* — Victor A Mandala
(74) *Attorney, Agent, or Firm* — Fenwick & West LLP

(57) ABSTRACT

A display device, such an organic light emitting display device is disclosed. The display device includes an insulating film including a concave portion in an area of at least one subpixel, a first electrode on a side portion of the concave portion and on the concave portion in an area of the subpixel, an organic layer overlapping the concave portion and on the first electrode. An organic layer disposed in the at least one blue subpixel may include at least one of a first light emitting dopant with a maximum emission wavelength of 457 nm or less, a second light emitting dopant with a full width at half maximum (FWHM) of 30 nm or less, and/or a third light emitting dopant with the maximum emission wavelength of 457 nm or less and the full width at half maximum of 30 nm or less. Thus, a display device with enhanced light extraction efficiency is provided.

20 Claims, 21 Drawing Sheets

Related U.S. Application Data continuation-in-part of application No. 16/706,476, filed on Dec. 6, 2019, now Pat. No. 10,756,288.

(51) Int. Cl.
*H10K 50/844* (2023.01)
*H10K 59/35* (2023.01)

(58) Field of Classification Search
CPC ........ H01L 51/5228; H01L 2251/5315; H10K 59/122; H10K 50/818; H10K 50/844; H10K 59/353; H10K 50/858; H10K 59/124
See application file for complete search history.

(56) References Cited

U.S. PATENT DOCUMENTS

| | | | |
|---|---|---|---|
| 10,756,288 B2* | 8/2020 | Kim | H01L 27/3246 |
| 11,018,323 B2 | 5/2021 | Lee et al. | |
| 11,289,557 B2* | 3/2022 | Kim | H01L 27/3246 |
| 2011/0031480 A1* | 2/2011 | Nakamura | H10K 50/828 257/E51.026 |
| 2014/0183499 A1* | 7/2014 | Kim | H10K 59/351 438/35 |
| 2016/0181562 A1* | 6/2016 | Pieh | H10K 50/852 257/40 |
| 2016/0293875 A1 | 10/2016 | Zhang et al. | |
| 2017/0125740 A1* | 5/2017 | Lee | H10K 50/856 |
| 2017/0317154 A1 | 11/2017 | Heo | |
| 2018/0211979 A1 | 7/2018 | Lee et al. | |
| 2019/0181188 A1* | 6/2019 | Youn | H10K 50/852 |
| 2019/0280065 A1* | 9/2019 | Kim | H10K 59/131 |
| 2020/0185480 A1 | 6/2020 | Heo | |
| 2020/0185655 A1* | 6/2020 | Jo | H10K 50/858 |
| 2020/0251688 A1* | 8/2020 | Chung | H10K 50/844 |
| 2021/0288291 A1 | 9/2021 | Lee et al. | |
| 2021/0320274 A1* | 10/2021 | Kim | H10K 50/16 |

FOREIGN PATENT DOCUMENTS

| | | |
|---|---|---|
| CN | 108346681 A | 7/2018 |
| EP | 3355357 A1 | 8/2018 |
| KR | 10-2007-0115478 A | 12/2007 |
| KR | 10-2017-0051764 A | 5/2017 |
| WO | WO 2012/105753 A2 | 8/2012 |

OTHER PUBLICATIONS

Extended European Search Report, European Patent Application No. 19216959.7, dated Apr. 21, 2020, 10 pages.

Xu, J. et al., "The Effects of Different Solvents and Excitation Wavelength on the Photophysical Properties of Two Novel Ir(IIII) Complexes Based on Phenylcinnoline Ligand," Journal of Fluorescence 23(5), May 9, 2013, pp. 865-875.

Yook and Lee, "Solution processed deep blue phosphorescent organic light-emitting diodes with over 20% external quantum efficiency," Organic Electronics, 12, 2011, pp. 1711-1715.

United States Office Action, U.S. Appl. No. 16/984,959, filed Aug. 26, 2021, seven pages.

* cited by examiner

FIG.8

| Dopant | Maximum emission wavelength | Full width at half maximum |
|---|---|---|
| Comparative Example 1 | 460nm | 47nm |
| First light emitting dopant | 457nm | 46nm |
| Second light emitting dopant | 463nm | 27nm |
| Third light emitting dopant | 457nm | 26nm |

FIG.12

| Dopant | Maximum emission wavelength | Full width at half maximum |
|---|---|---|
| Comparative Example 3 | 526nm | exceeding 64nm |
| Fourth light emitting dopant | 522nm | 64nm |
| Fifth light emitting dopant | 526nm | 62nm |
| Sixth light emitting dopant | 522nm | 62nm |

ORGANIC LIGHT EMITTING DISPLAY PANEL AND ORGANIC LIGHT EMITTING DISPLAY DEVICE INCLUDING THE SAME

CROSS-REFERENCE TO RELATED APPLICATION

This application is a continuation of U.S. patent application Ser. No. 16/984,959 filed on Aug. 4, 2020 which is a continuation-in-part of U.S. patent application Ser. No. 16/706,476 filed Dec. 6, 2019 which claims the priority benefit of Republic of Korea Patent Application No. 10-2018-0163392, filed on Dec. 17, 2018, each of which is incorporated herein by reference in its entirety.

BACKGROUND

Field of the Disclosure

The present disclosure relates to an organic light emitting display panel and an organic light emitting display device including the same.

Description of the Background

As the advent of the information society, there have been growing needs for various display panels for using in display devices, lighting devices, or the like. Among various types of display panel, an organic light emitting display panel is advantageous in a reduction in overall weight and thickness as an additional light source is not required. As a result, demands for the organic light emitting display panel have increased steadily.

However, when the organic light emitting display panel including an organic layer emitting light is operated, there is a problem that light extraction efficiency of the organic light emitting display panel is lowered and corresponding luminance efficiency is lowered because some of the light emitted from an organic layer cannot be emitted to outside of the organic light emitting display panel, and therefore trapped inside the organic light emitting display device.

SUMMARY

Accordingly, the present disclosure is directed to an organic light emitting display panels and organic light emitting display devices that substantially obviate one or more problems due to limitations and disadvantages of the prior art, and has enhanced light extraction efficiency. Additional features and advantages of the disclosure will be set forth in the description which follows and in part will be apparent from the description, or may be learned by practice of the disclosure. The objectives and other advantages of the disclosure will be realized and attained by the structure particularly pointed out in the written description and claims hereof as well as the appended drawings.

It is at least one object of the present disclosure to provide organic light emitting display panels and organic light emitting display devices having a structure for preventing color mixing between adjacent subpixels.

It is further at least one object of the present disclosure to provide organic light emitting display panels and organic light emitting display devices having a structure for reducing a distance that light emitted from an organic layer is extracted to outside of the display panel.

It is still at least one object of the present disclosure to provide organic light emitting display panels and organic light emitting display devices having a structure in which color coordinates of one or more light emitting areas which emit an identical color correspond to one another.

In accordance with embodiments of the present disclosure an organic light emitting display panel comprises: a substrate including an active area having a plurality of subpixels, an image displayed in the active area; an insulating film over the substrate, the insulating film including at least one concave portion in the active area of a subpixel from the plurality of subpixels, the concave portion having a flat portion and an inclined portion that extends from the flat portion, and a side portion that extends from the inclined portion, the side portion farther from the substrate than the inclined portion and flat portion; a first electrode disposed on the flat portion, the inclined portion, and the side portion of the concave portion of the insulating film; a bank on the first electrode, the bank including a first part and a second part, wherein the first part of the bank overlaps the inclined portion of the insulating film and the second part of the bank overlaps the side portion of the insulating film; an organic layer on the first electrode and overlapping the concave portion of the insulating film, the organic layer including at least one of a first light emitting dopant with a maximum emission wavelength of 457 nm or less, a second light emitting dopant with a full width at half maximum (FWHM) of 30 nm or less, or a third light emitting dopant with the maximum emission wavelength of 457 nm or less and the full width at half maximum of 30 nm or less; and a second electrode on the organic layer and the bank.

In one embodiment, an organic light emitting display device comprises: a substrate including an active area having a plurality of subpixels, an image displayed in the active area; an insulating film over the substrate, the insulating film including a concave portion in the active area of a subpixel from the plurality of subpixels, the concave portion having a flat portion, an inclined portion that extends from the flat portion, and a side portion that extends from the inclined portion, the side portion farther from the substrate than the inclined portion and the flat portion; a first electrode disposed on the flat portion and the inclined portion of the concave portion of the insulating film; a bank on the first electrode, the bank including a first part and a second part, wherein the first part of the bank overlaps the inclined portion of the insulating film and the second part of the bank overlaps the side portion of the insulating film; an organic layer on the first electrode and overlapping the concave portion of the insulating film, the organic layer emitting blue light and including a first light emitting dopant with a maximum emission wavelength of 457 nm or less or a second light emitting dopant with a full width at half maximum (FWHM) of 30 nm or less; a second electrode disposed on the organic layer and the bank; and a capping layer on all of the second electrode or all of the second electrode excluding a portion of the second electrode overlapping the flat portion of the concave portion, wherein a first area in which the bank and the first electrode do not overlap in the concave portion is a first light emitting area, a second area in which the first electrode that overlaps the first part of the bank is a first non-light emitting area, a third area in which the first electrode overlaps the inclined portion is a second light emitting area, and a third area in which the first electrode overlaps the first part of the bank is a second non-light emitting area.

In accordance with embodiments of the present disclosure, it is possible to provide organic light emitting display panels and organic light emitting display devices having a structure in which luminous efficiency is enhanced.

In accordance with embodiments of the present disclosure, it is possible to provide organic light emitting display panels and organic light emitting display devices capable of preventing color mixing between adjacent subpixels.

In accordance with embodiments of the present disclosure, it is possible to provide organic light emitting display panels and organic light emitting display devices having a structure for reducing a distance that light emitted from an organic layer is extracted to outside of the display.

In accordance with embodiments of the present disclosure, it is possible to provide organic light emitting display panels and organic light emitting display devices having a structure in which color coordinates of one or more light emitting areas which emit an identical color correspond to one another. It is to be understood that both the foregoing general description and the following detailed description are exemplary and explanatory and are intended to provide further explanation of the disclosure as claimed.

BRIEF DESCRIPTION OF THE DRAWINGS

FIGS. 7 and 8 are views illustrating characteristics of a light emitting dopant applicable to a light emitting layer of the organic light emitting display panel according to embodiments of the present disclosure.

FIGS. 11 and 12 are views illustrating characteristics of a light emitting dopant applicable to a light emitting layer of the organic light emitting display panel according to embodiments of the present disclosure.

DETAILED DESCRIPTION

Figure 1:
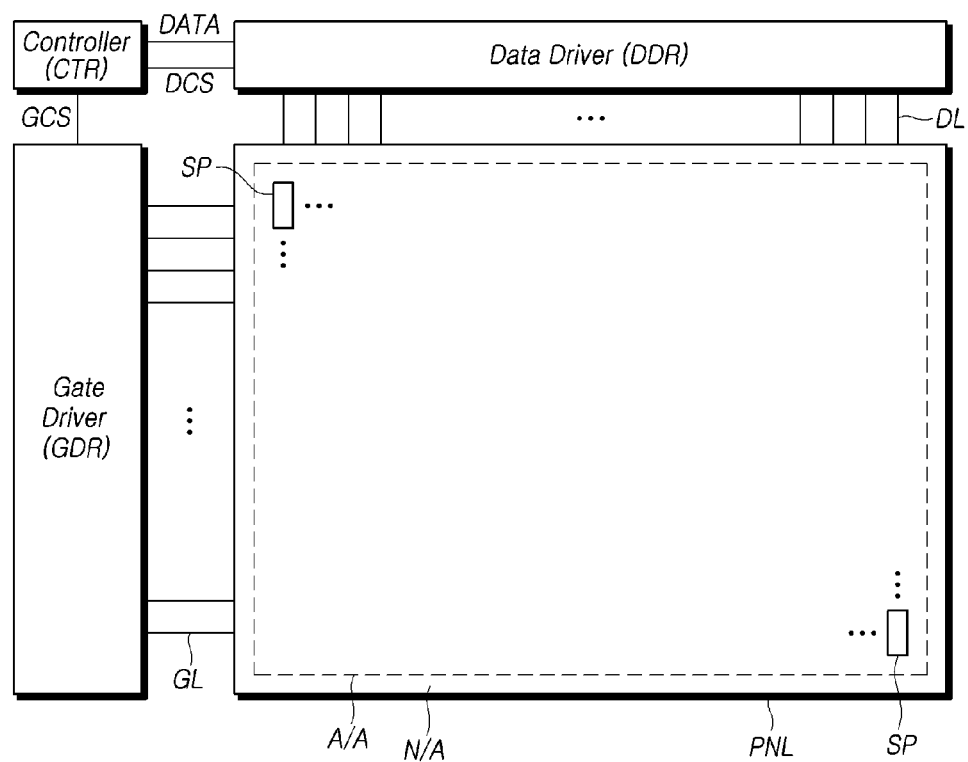
FIG. 1 is a block diagram schematically illustrating a configuration of an organic light emitting display device according to embodiments of the present disclosure.

The advantages and features of the present disclosure and methods of achieving the same will be apparent by referring to aspects of the present disclosure as described below in detail in conjunction with the accompanying drawings. However, the present disclosure is not limited to the aspects set forth below, but may be implemented in various different forms. The following aspects are provided only to completely disclose the present disclosure and inform those skilled in the art of the scope of the present disclosure, and the present disclosure is defined only by the scope of the appended claims.

In addition, the shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description may make the subject matter in some embodiments of the present disclosure rather unclear. The terms such as "including", "having", "containing", and "comprising" used herein are generally intended to allow other components to be added unless the terms are used with the term "only". As used herein, singular forms are intended to include plural forms unless the context clearly indicates otherwise.

In interpreting any elements or features of the embodiments of the present disclosure, it should be considered that any dimensions and relative sizes of layers, areas and regions include a tolerance or error range even when a specific description is not conducted.

Terms, such as first, second, A, B, (A), or (B) may be used herein to describe elements of the disclosure. Each of the terms is not used to define essence, order, sequence, or number of an element, but is used merely to distinguish the corresponding element from another element. When it is mentioned that an element is "connected" or "coupled" to another element, it should be interpreted that another element may be "interposed" between the elements or the elements may be "connected" or "coupled" to each other via another element as well as that one element is directly connected or coupled to another element. Spatially relative terms, such as, "on", "over", "above", "below", "under", "beneath", "lower", "upper", "near", "close", "adjacent", and the like, may be used herein to describe one element or feature's relationship to another element(s) or feature(s) as illustrated in the figures, and it should be interpreted that one or more elements may be further "interposed" between the elements unless the terms such as "directly", "only" are used.

Any elements or features of the embodiments of the present disclosure are not limited to a specific meaning of the terms described above. The terms as used herein are merely for the purpose of describing examples and are not intended to limit the present disclosure. Although the terms "first", "second", and the like are used for describing various elements, or features, these elements are not confined by these terms. These terms are merely used for distinguishing one element from other elements. Therefore, a first element to be mentioned below may be a second element in a technical concept of the present disclosure. Further, the term "may" fully encompasses all the meanings of the term "can".

The elements or features of various exemplary embodiments of the present disclosure can be partially or entirely bonded to or combined with each other and can be interlocked and operated in technically various ways as can be fully understood by a person having ordinary skill in the art, and the various exemplary embodiments can be carried out independently of or in association with each other.

Hereinafter, exemplary embodiments of the present disclosure will be described in detail with reference to the accompanying drawings.

FIG. 1 is a block diagram schematically illustrating a configuration of an organic light emitting display device according to embodiments of the present disclosure.

In accordance with embodiments of the present disclosure, the display device may include a panel PNL for displaying images or outputting light, and a driving circuit (or a driver) for driving the panel PNL.

The panel PNL may include a plurality of data lines DL and a plurality of gate lines GL, and include a plurality of subpixels SP that is defined by the plurality of data lines DL and the plurality of gate lines GL and that is arranged in a matrix form.

The plurality of data lines DL and the plurality of gate lines GL may be arranged to intersect each other in the panel PNL. For example, the plurality of gate lines GL may be arranged in a first direction or on one of a row or a column, and the plurality of data lines DL may be arranged in a second direction or on the other of the row or the column Hereinafter, for convenience of description and ease of understanding, it may be considered that the plurality of gate lines GL is arranged on one or more rows and the plurality of data lines DL is arranged on one or more columns.

The panel PNL may include other types of signal line other than the plurality of data lines DL and the plurality of gate lines GL, according to a structure of a subpixel, etc. For example, the display panel may further include at least one driving voltage line, at least one reference voltage line, at least one common voltage line, or the like.

For example, one or more different types of signal line may be disposed in the panel PNL depending on a structure of subpixels, a type of panel (e.g., an LCD panel, an OLED panel, etc.), or the like. In the present disclosure, the signal line may denote a term including an electrode to which a signal is applied.

The panel PNL may include an active area A/A in which an image is displayed, and a non-active area N/A in which an image is not displayed, which is located in an outer area of the active area A/A. Here, the non-active area N/A may be referred to as a bezel area or an edge area of the panel or the display device.

A plurality of subpixels SP is arranged in the active area A/A for displaying images.

A pad area including at least one pad, such as a conductive trace, and electrically connected to a data driver DDR is disposed in the non-active area N/A. A plurality of data link lines may be disposed in the non-active area N/A for electrically connecting the pad area to the plurality of data lines DL. In this case, the plurality of data link lines may be a part of the plurality of data lines DL extending to the non-active area N/A, or be separate patterns electrically connected to the plurality of data lines DL.

In addition, the non-active area N/A further may include gate-driving-related lines for delivering a voltage (signal) needed for driving at least one gate of at least one transistor for driving at least one subpixel from the pad electrically connected to the data driver DDR to a gate driver GDR. For example, the gate-driving-related lines may include clock lines for delivering clock signals, gate voltage lines for delivering gate voltages VGH and VGL, gate driving control signal lines for delivering various control signals needed for generating scan signals, or the like. The gate-driving-related lines are arranged in the non-active area N/A, unlike gate lines GL arranged in the active area A/A.

The driving circuit may include the data driver DDR for driving the plurality of data lines DL, the gate driver GDR for driving the plurality of gate lines GL, and a controller CTR for controlling the data driver DDR and the gate driver GDR.

The data driver DDR may drive the plurality of data lines DL by outputting data voltages to the plurality of data lines DL.

The gate driver GDR may drive the plurality of gate lines GL by outputting scan signals to the plurality of gate lines GL.

The controller CTR may provide various control signals DCS and GCS needed for driving and/or operating the data driver DDR and the gate driver GDR, and control the driving and/or operating of the data driver DDR and the gate driver GDR. In addition, the controller CTR may provide image data DATA to the data driver DDR.

The controller CTR starts scanning operation according to timing processed in each frame, converts image data input from other devices or image providing sources to a data signal form used in the data driver DDR and then outputs image data DATA resulted from the converting, and controls the driving of at least one data line at a pre-configured time aligned with the scanning operation.

In order to control the data driver DDR and the gate driver GDR, the controller CTR receives a timing signal, such as, a vertical synchronous signal Vsync, a horizontal synchronous signal Hsync, an input data enable DE signal, a clock signal CLK, or the like, from other devices or image providing sources, such as, a host system, and generates various control signals and outputs the generated signals to the data driver DDR and the gate driver GDR.

For example, to control the gate driver GDR, the controller CTR outputs various gate control signals GCS including a gate start pulse GSP, a gate shift clock GSC, a gate output enable signal GOE, or the like.

In addition, to control data driver DDR, the controller CTR outputs various data control signals DCS including a source start pulse SSP, a source sampling clock SSC, a source output enable signal SOE, or the like.

The controller CTR may be a timing controller used in the typical display technology or a control apparatus/device capable of additionally performing other control functionalities in addition to the typical function of the timing controller.

The controller CTR may be implemented as a separate unit from the data driver DDR, or integrated with the data driver DDR and implemented as an integrated circuit.

The data driver DDR receives image data DATA from the controller CTR, and provides data voltages to the plurality of data lines DL. Thus, the data driver DDR drives the plurality of data lines DL. Herein, the data driver DDR may also be referred to as a "source driver."

The data driver DDR may transmit various signals to and/or receive them from the controller CTR through various interfaces.

The gate driver GDR sequentially drives the plurality of gate lines GL by sequentially providing scan signals to the plurality of gate lines GL. Herein, the gate driver GDR may also be referred to as a "scan driver."

According to controlling of the controller CTR, the gate driver GDR sequentially provide a scan signal, such as an on-voltage or an off-voltage to the plurality of gate lines GL.

When a specific gate line is asserted by a scan signal from the gate driver GDR, the data driver DDR converts image data DATA received from the controller CTR into analog data voltages and provides the resulted analog data voltages to the plurality of data lines DL.

The data driver DDR may be located on, but not limited to, only one side (e.g., an upper side or a lower side) of the panel PNL, or in some embodiments, be located on, but not limited to, two sides (e.g., an upper side and a lower side) of the panel PNL according to driving schemes, panel design schemes, or the like.

The gate driver GDR may be located on, but not limited to, only one side (e.g., a left side or a right side) of the panel PNL, or in some embodiments, be located on, but not limited to, two sides (e.g., a left side and a right side) of the panel PNL according to driving schemes, panel design schemes, or the like.

The data driver DDR may be implemented by including one or more source driver integrated circuits SDIC.

Each source driver integrated circuit SDIC may include a shift register, a latch circuit, a digital to analog converter DAC, an output buffer, or the like. In some embodiments, the data driver DDR may further include one or more analog to digital converters ADC.

Each source driver integrated circuit SDIC may be connected to the pad, such as a bonding pad, of the panel PNL in a tape automated bonding (TAB) type or a chip on glass (COG) type, or be directly disposed on the panel PNL. In some instances, each source driver integrated SDIC may be integrated and disposed on the panel PNL. In addition, each source driver integrated circuit SDIC may be implemented in a chip on film (COF) type. In this case, each source driver integrated circuit SDIC may be mounted on a circuit film and electrically connected to the data lines DL arranged in the panel PNL through the circuit film.

The gate driver GDR may include a plurality of gate driving circuits GDC. The plurality of gate driving circuits GDC may correspond to the plurality of gate lines GL, respectively.

Each gate driving circuit GDC may include a shift register, a level shifter, and the like.

Each gate driving circuit GDC may be connected to the pad, such as a bonding pad, of the panel PNL in a tape automated bonding (TAB) type or a chip on glass (COG) type. In addition, each gate driving circuit GDC may be implemented in a chip on film (COF) type. In this case, each gate driving circuit GDC may be mounted on a circuit film and electrically connected to the gate lines GL arranged in the panel PNL through the circuit film. In addition, each gate driving circuit GDC may be integrated into the panel PNL in a gate in panel (GIP) type. That is, each gate driving circuit GDC may be directly formed in the panel PNL.

Figure 2:
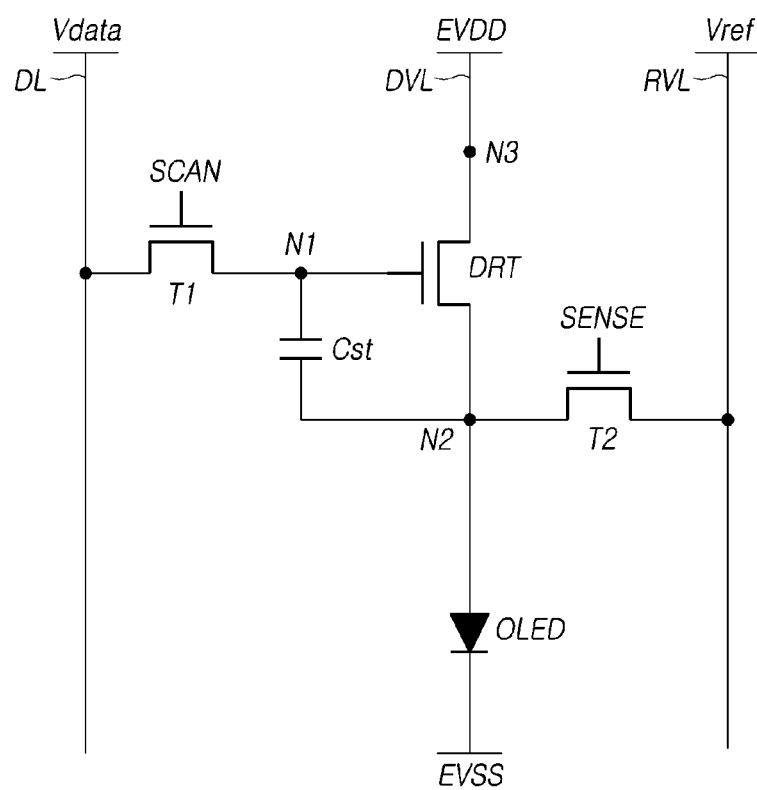
FIG. 2 is a view illustrating a 3T (Transistor) 1C (Capacitor) structure in which one subpixel further includes a second transistor electrically connected between a second node of a driving transistor and a reference voltage line.

FIG. 2 is a view illustrating a 3T (Transistor) 1C (Capacitor) structure in which one subpixel further includes a second transistor electrically connected between a second node of a driving transistor and a reference voltage line.

Referring to FIG. 2, the second transistor T2 may be electrically connected between the second node N2 of the driving transistor DRT and the reference voltage line RVL, and on-off operations of the second transistor T2 may be controlled by receiving a sense signal SENSE through its gate node.

A drain node or a source node of the second transistor T2 is electrically connected to the reference voltage line RVL, and the source node or the drain node of the second transistor T2 is electrically connected to the second node N2 of the driving transistor DRT.

The second transistor T2 may be turned on during a display driving section, or turned on during a sensing driving section for sensing characteristic values of the driving transistor DRT or characteristic values of an organic light emitting diode OLED.

The second transistor T2 may be turned on by the sense signal SENSE according to a corresponding driving timing (e.g., a display driving timing or a reset timing in the sensing driving section), and transfer a reference voltage Vref supplied to the reference voltage line RVL to the second node N2 of the driving transistor DRT.

In addition, the second transistor T2 may be turned on by the sense signal SENSE according to a corresponding driving timing (e.g., a sampling timing in the sensing driving section), and transfer a voltage of the second node N2 of the driving transistor DRT to the reference voltage line RVL.

In other words, the second transistor T2 may control a voltage state of the second node N2 of the driving transistor DRT, or transfer the voltage of the second node N2 of the driving transistor DRT to the reference voltage line RVL.

The reference voltage line RVL may be electrically connected to the analog to digital converter that senses a voltage of the reference voltage line RVL, converts the sensed voltage to a digital value, and outputs sensing data including the digital value.

The analog to digital converter may be included in a source driving integrated circuit SDIC implementing the data driver DDR.

The sensing data from the analog to digital converter may be used for sensing characteristic values (e.g., a threshold voltage, mobility, etc.) of the driving transistor DRT or characteristic values (e.g., a threshold voltage, etc.) of the organic light emitting diode OLED.

Meanwhile, a storage capacitor Cst may be an external capacitor configured to be located on outside of the driving transistor DRT other than an internal capacitor, that is, a parasitic capacitor (e.g., a Cgs, a Cgd), that presents between a 1 node (N1) and the second node N2 of the driving transistor DRT.

Each of the driving transistor DRT, a first transistor W2 and the second transistor T2 may be an n-type transistor or a p-type transistor.

A first scan signal SCAN and the sense signal SENSE may be different gate signals. In this case, the first scan signal SCAN and the sense signal SENSE respectively may be supplied to a gate node of the first transistor T1 and a gate node of the second transistor T2 through different gate lines.

The first scan signal SCAN and the sense signal SENSE may be an identical gate signal. In this case, the identical gate signal may be commonly supplied to the gate node of the first transistor T1 and the gate node of the second transistor T2 through an identical gate line.

It is noted that the subpixel structure as shown in FIG. 2 is merely one example of possible structures, and one or more transistors may be removed, or one or more transistors may be further included. In some embodiments, one or more capacitors may be further included.

In some embodiments, a plurality of subpixels may have an identical structure, or one or more of the plurality of subpixels may have different structure from others.

Luminance of the panel PNL may be different depending on an amount of light that is extracted to outside of the panel (hereinafter, referred to as the term "amount of extracted light" convenience of description) after having been emitted from the organic light emitting device disposed in the active area A/A. In other words, the luminance of the panel PNL may enhance as an amount of light extracted to outside of the panel from the organic light emitting device increases. Hereinafter, a structure of a substrate configured with an array of thin film transistors will be described for enhancing an amount of extracted light.

In accordance with embodiments of the present disclosure, a display panel, such an organic light emitting display panel etc. includes: a substrate including an active area over which a plurality of subpixels is disposed, an insulating film disposed over the substrate and including at least one concave portion in an area of at least one subpixel, a first electrode disposed on an side portion of the concave portion and on the concave portion in an area of at least one subpixel, a bank including a first part disposed on a part of the concave portion, and a second part disposed on the side portion, an organic layer overlapping the concave portion and disposed on the first electrode, a second electrode disposed on the organic layer and the bank, and a capping layer disposed on all or a part of the second electrode. The plurality of subpixels may include at least one blue subpixel. The organic layer disposed in the at least one blue subpixel may include at least one type of light emitting dopant with a maximum emission wavelength of 457 nm or less or with a full width at half maximum (FWHM) of 30 nm or less. The capping layer may be formed of at least one layer of inorganic material.

At least one concave portion may be included in an insulating film of at least one of the plurality of subpixels disposed in the active area.

The organic light emitting display panel as described above will be discussed in detail with reference to the accompanying drawings.

Figure 3:
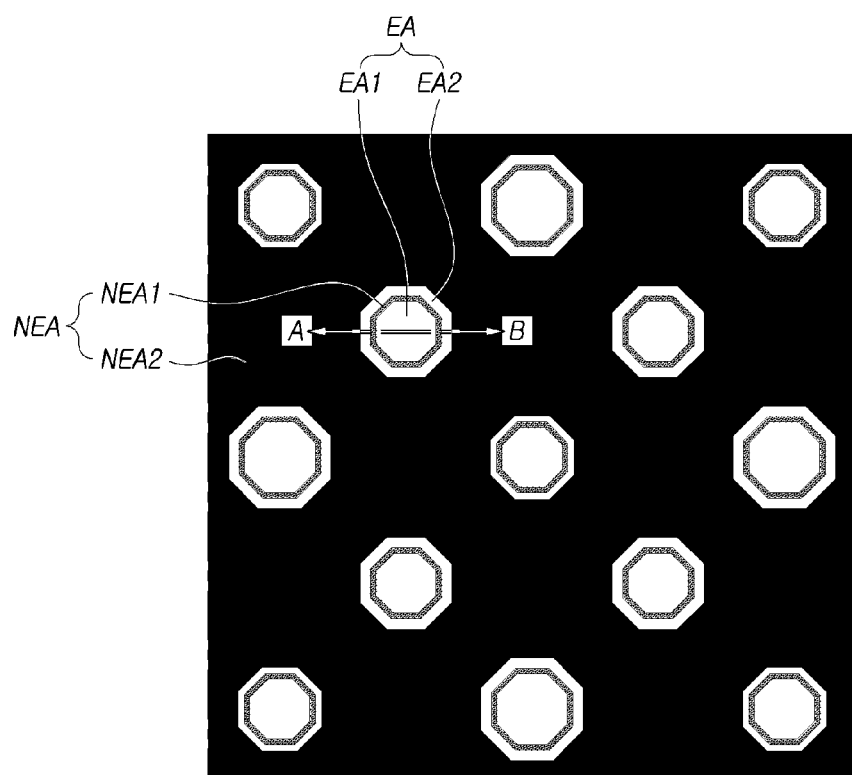
FIG. 3 is a plan view illustrating a light emitting area and a non-light emitting area included in an active area of the organic light emitting display panel according to embodiments of the present disclosure.
Figure 4:
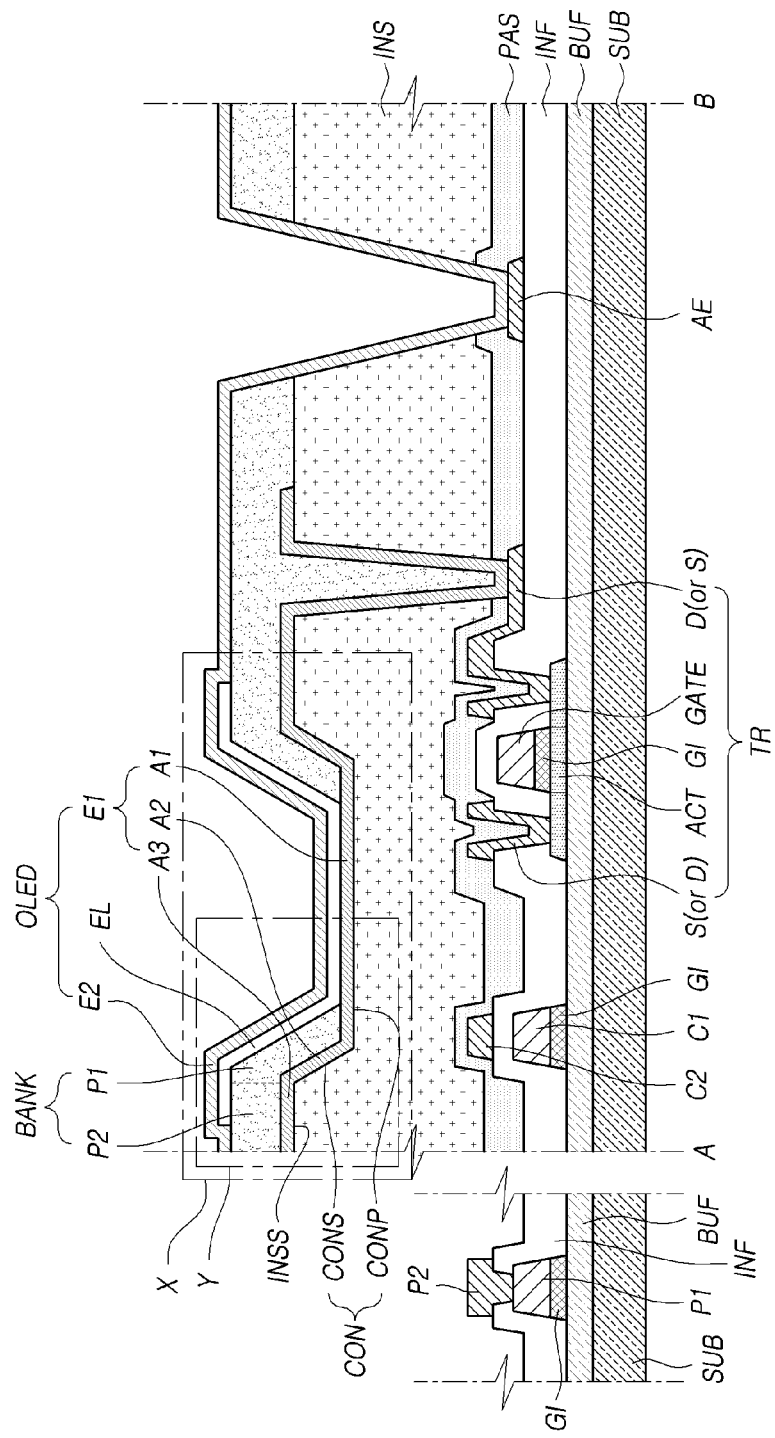
FIG. 4 is a cross-sectional view illustrating a part of a pad area taken along with line A-B of FIG. 3 according to embodiments of the present disclosure.

FIG. 3 is a plan view illustrating a light emitting area and a non-light emitting area included in an active area of the organic light emitting display panel according to embodiments of the present disclosure. FIG. 4 is a cross-sectional view illustrating a part of a pad area taken along with line A-B of FIG. 3 according to embodiments of the present disclosure. FIG. 4 may be some of configurations and areas disposed in one subpixel, and more specifically, may be some configurations and areas disposed in the pad area.

Referring to FIG. 3, a plurality of light emitting areas EA and a plurality of non-light emitting areas NEA are disposed in the active area A/A.

As shown in FIG. 3, sizes of the light emitting areas EA of two or more subpixels SP may be different in some instances, but embodiments of the present disclosure are not limited thereto.

Each subpixel SP disposed in the active area A/A may include a plurality of light emitting areas EA1 and EA2.

Specifically, one subpixel SP may include a first light emitting area EA1 and a second light emitting area EA2 surrounding the first light emitting area EA1.

A first non-light emitting area NEA1 may be disposed between the first light emitting area EA1 and the second light emitting area EA2. As shown in FIG. 3, the first light emitting area EA1 and the second light emitting area EA2 are concentric with the first non-light emitting area NEA1 disposed between the first light emitting area EA1 and the second light emitting area EA2.

The first light emitting area EA1 and the second light emitting area EA2 may be separated from each other by the first non-light emitting area NEA1.

As shown in FIG. 3. the first light emitting area EA1, the second light emitting area EA2, and the first non-light emitting area NEA1 may be octagonal in plan view. However, embodiments of the present disclosure are not limited thereto. The first light emitting area EA1, the second light emitting area EA2, and the first non-light emitting area NEA1 may be circular, elliptical, or polygonal, such as triangular, square, hexagonal, etc. or combinations thereof, in a plan view.

A pair of first and second light emitting areas EA1 and EA2 may be spaced apart from another pair of first and second light emitting areas EA1 and EA2. A second non-light emitting area NEA2 may be disposed between one pair of first and second light emitting areas EA1 and EA2 and another pair of first and second light emitting areas EA1 and EA2.

The second non-light emitting area NEA2 may be an area corresponding to all or a part of a circuit unit including a circuit for driving the first and second light emitting areas EA1 and EA2.

Referring to FIG. 4, a transistor TR disposed over the substrate SUB and an organic light emitting device OLED electrically connected to the transistor TR are disposed in the active area (an area taken along with A/A, A-B). In addition, at least one pad area is located in the non-active area (N/A).

The transistor TR may include the activation layer ACT, a gate electrode GATE, a source electrode S and a drain electrode D.

The organic light emitting device OLED includes a first electrode E1, an organic layer EL including a light emitting layer, and a second electrode E2. Here, the first electrode E1 may be an anode electrode, and the second electrode E2 may be a cathode electrode. However, the embodiments of the present disclosure are not limited thereto.

Specifically, a buffer layer BUF is disposed on the substrate SUB. The active layer ACT of the transistor is disposed on the buffer layer BUF. A gate insulating film GI is disposed on the activation layer ACT, and the gate electrode GATE is disposed on the gate insulating film GI.

Meanwhile, although not shown in FIG. 4, the active layer ACT according to embodiments of the present disclosure includes a channel area. The channel area of the active layer ACT may overlay with the gate insulating film GI and the gate electrode GATE. In other words, the gate insulating film GI and the gate electrode GATE may be disposed on the channel area of the active layer ACT.

An interlayer insulating film INF is disposed on the gate electrode GATE. The source electrode S and the drain electrode D are disposed on the interlayer insulating film INF. The source electrode S and the drain electrode D may be disposed to spaced apart from each other on the interlayer insulating film INF. Each of the source electrode S and the drain electrode D may contact the active layer ACT through a hole formed through the interlayer insulating film INF.

The transistor may be disposed over the substrate SUB based on the structure described above, but transistor structures of the present disclosure are not limited thereto.

For example, the gate electrode GATE may be disposed over the substrate SUB, the active layer ACT may be disposed over the gate electrode, and the source electrode S may be disposed to overlap one end of the active layer ACT and the drain electrode D may be disposed to overlap the other end of the active layer ACT, over the active layer ACT.

Further, a passivation layer PAS may be disposed to cover the transistor.

The insulating film INFA may be disposed on the passivation layer PAS.

The insulating film INS may be formed of an organic material, but embodiments of the present disclosure are not limited thereto.

Such an insulating film INS may have at least one concave portion CON in one subpixel area. The insulating film INS may surround the concave portion CON and have a side portion INSS located around the concave portion CON. The concave portion CON may include a flat portion CONP and an inclined portion CONS surrounding the flat portion CONP.

A surface of the flat portion CONP of the concave portion CON may be a portion parallel to a surface of the substrate SUB. The inclined portion CONS may surround the flat portion CONP. The surface of the inclined portion CONS may be a portion having a certain angle with respect to the surface of the substrate SUB. That is, a surface of the inclined portion CONS may not be parallel (i.e., non-parallel) to the surface of the substrate SUB.

In addition, the insulating film INS may have a hole spaced from the concave portion CON.

In addition, the first electrode E1 may be disposed on a side portion INSS and the concave portion CON of the insulating film INS in at least one subpixel area.

Meanwhile, the first electrode E1 includes a first area A1 in which a surface of the first electrode E1 is parallel to the surface of the substrate SUB, and a second area A2 which extends from the first area A1, and in which the surface of the first electrode E1 has a certain angle to the surface of the substrate SUB, in an area overlapping the concave portion CON. That is, a surface of the second area A2 may not be parallel to the surface of the substrate SUB. The first electrode E1 extends from the second area A2 and includes a third area A3 in which the surface of the first electrode E1 is parallel to the surface of the substrate SUB. The third area A3 may be an area overlapping the side portion INSS of the concave portion CON.

In addition, as described above, the insulating film INS may include at least one hole spaced from the concave portion CON in at least one subpixel area. The transistor TR and the first electrode E1 of the organic light emitting device OLED may be electrically connected through the hole of the insulating film INS.

Specifically, the first electrode E1 may be electrically connected to the source electrode S or the drain electrode D of the transistor TR.

The bank BANK may be disposed on a part of the first electrode E1 and the insulating film INS.

The bank BANK may include the first part P1 on the first electrode E1 in an area corresponding to a part of the concave portion CON of the insulating film INS, and the second part P2 on the first electrode E1 and the insulating film INS in an area corresponding to the side portion INSS of the insulating film INS.

Such a bank BANK may be disposed not to cover a part of the upper surface of the first electrode E1 in an area overlapping the concave portion CON. That is, at least one subpixel may have an area in which the first electrode E1 does not overlap the bank BANK.

The organic layer EL including a light emitting layer may be disposed on the first electrode E1 not overlapping the bank BANK. Such an organic layer EL may overlap a part of the first electrode EL and a part of the bank BANK.

In addition, the second electrode E2 may be disposed to cover the organic layer EL and the bank BANK.

Meanwhile, the organic layer EL of the organic light emitting device OLED may be formed by a vapor deposition or coating method having straightness. For example, the organic layer EL may be formed by a physical vapor deposition PVD method such as an evaporation process.

In the organic layer EL formed by methods described above, a thickness of an area with a certain angle to the horizon or the surface of the substrate may be thinner than a thickness of an area parallel to the horizon or the surface of the substrate.

For example, a thickness of the organic layer EL in an area corresponding to inclined portion CONS of the concave portion CON may be thinner than that of the organic layer EL on an upper surface of the first electrode E1 not covered by the bank BANK. In addition, the thickness of the organic layer EL in an area corresponding to inclined portion CONS of the concave portion CON may be thinner than that of the organic layer EL on the side portion INSS of the concave portion CON.

When the organic light emitting device OLED is driven, an area in which the thickness of the organic layer EL is relatively thin, that is, the area corresponding to the inclined portion CONS of the concave portion CON may have the highest current density and the highest electric field.

Accordingly, luminescence characteristics of the organic light emitting device OLED in the area corresponding to the inclined portion CONS of the concave portion CON may be different from luminescence characteristics of the organic light emitting device OLED in the area corresponding to the flat portion CONP of the concave portion CON, and thus such a structure may accelerate degradation of electronic elements.

In accordance with embodiments of the present disclosure, since the bank BANK is disposed to cover the inclined portion CONS of the concave portion CON, it is therefore possible to prevent the degradation of electronic elements in the area corresponding to the inclined portion CONS of the concave portion CON and to prevent the phenomenon that luminescence characteristics are different in each area.

However, embodiments of the present disclosure are not limited to such a thickness of the organic layer EL, and the thickness of the organic layer EL may have a thickness corresponding to its location.

The first electrode E1 may be configured to include the reflective electrode.

The first electrode E1 may be disposed to cover the flat portion CONP and the inclined portion CONS of the concave portion CON of the insulating film INS.

The second electrode E2 may be formed of a semitransparent material or a transparent conductive material.

Thus, some of light emitted from the organic layer EL may be reflected from the first electrode E1 disposed in an area corresponding to the inclined portion CONS and then be extracted to outside of the panel PNL. When some of the light emitted from the organic layer EL is extracted to outside of the panel by being reflected from the first part A2 of the first electrode E1, the light may be extracted to the outside without being absorbed into the second electrode E2.

Accordingly, it is possible to enhance light extraction efficiency of the organic light emitting display panel.

In addition, as shown in FIG. 4, an auxiliary electrode AE (or may be referred to as an auxiliary line) contacting second electrode E2 may be further disposed in an area corresponding to the second non-light emitting area NEA2 in the active area A/A.

Specifically, the auxiliary electrode AE may be disposed on the interlayer insulating film INF. The passivation layer PAS, the insulating film INS and the bank BNK may have a hole that does not cover the auxiliary electrode AE. The second electrode E2 may contact the auxiliary electrode AE through the hole of the passivation layer PAS, the insulating film INS and the bank layer BNK.

For example, in case the organic light emitting display panel is a display panel having a large area, voltage drop due to the resistance of the second electrode E2 may occur, resulting in a luminance difference between the outer edge and the center of the panel. However, in the organic light emitting display panel according to embodiments of the present disclosure, it is possible to overcome the occurring of voltage drop through the auxiliary electrode AE contacting the second electrode E2. Thus, in case the organic light emitting display panel according to embodiments of the present disclosure has a large area, it is possible to prevent the occurrence of the luminance difference in the panel.

FIG. 4 shows that one auxiliary electrode AE is disposed in one subpixel SP, but present disclosure does not limit thereto. For example, one auxiliary electrode AE may be disposed per on a plurality of subpixels SP basis.

For another example, in case the organic light emitting display panel according to embodiments of the present disclosure does not have a large area, the panel may not include the auxiliary electrode AE.

As shown in FIG. 4, at least one storage capacitor may be disposed in the active area A/A. The storage capacitor may include a first storage capacitor electrode C1 disposed in an identical layer to the gate electrode GATE and a second storage capacitor electrode C2 disposed in an identical layer to the source electrode S and the drain electrode (D), but the structure of the storage capacitors of the present disclosure is not limited thereto.

In addition, the display panel according to embodiments of the present disclosure may include a pad area disposed in the non-active area. A plurality of pad electrodes P1 and P2 may be disposed in the pad area.

For example, a first pad electrode P1 may be disposed on the plurality of insulating films BUF and GI disposed in the pad area. The interlayer insulating film INF may be disposed on the first pad electrode P1, a part of an upper surface of which is not covered by the first pad electrode P1. A second pad electrode P2 that contacts the first pad electrode P1 may be disposed over the first pad electrode P1 and the interlayer insulating film INF.

Although not shown in FIG. 4, various circuit films etc. may be electrically connected to the second pad electrode P2.

A structure of the organic light emitting display panel according to embodiments of the present disclosure and corresponding paths of light will be discussed in detail with reference to FIGS. 5 and 6.

Figure 5:
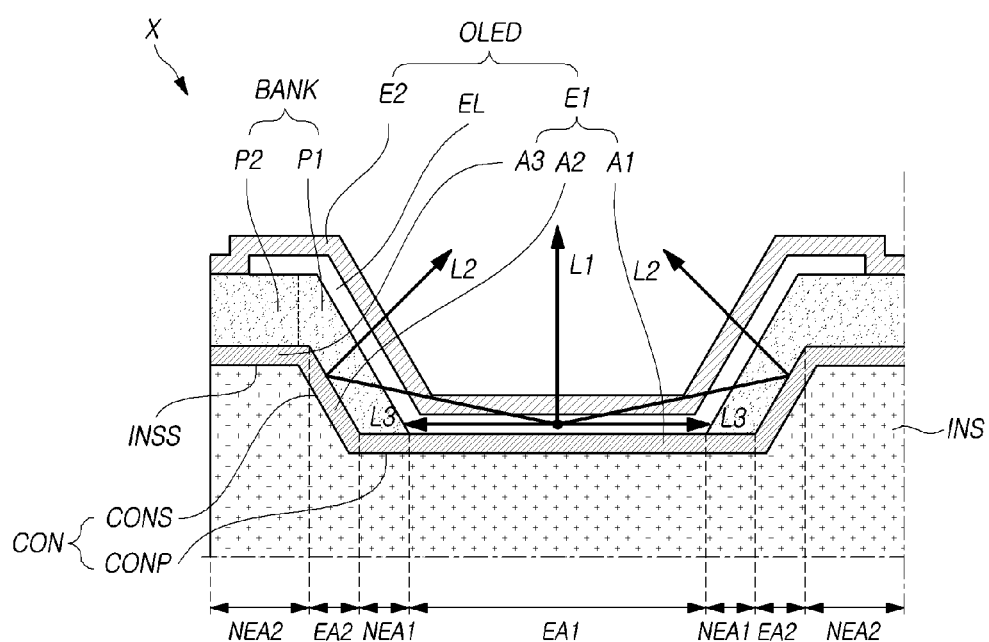
FIG. 5 is an expanded view of an X portion in FIG. 4 to embodiments of the present disclosure.

FIG. 5 is an expanded view of an X portion in FIG. 4. FIG. 6 is an expanded view of a Y portion in FIG. 4.

Referring to FIG. 5, at least one subpixel SP may include at least two light emitting areas EA1 and EA2. A non-light emitting area NEA1 may be disposed between two light emitting areas EA1 and EA2.

Specifically, a first light emitting area EA1 may be an area corresponding to a part of the concave portion CON of the insulating film INS.

In other words, the first light emitting area EA1 may be an area non-overlapping the first part P1 of the bank BANK in the flat portion CONP of the concave portion CON.

In addition, the first light emitting area EA1 may be an area in which some L1 of light emitted from the organic layer EL is extracted to outside of the panel through the organic layer EL and the second electrode E2.

Further, the first light emitting area EA1 may be an area in which some L1 (hereinafter, referred to as "first light") of light emitted from the organic layer EL is reflected from the first electrode E1 after having reached the first electrode E1, and then, the reflected light is extracted to outside of the panel through the organic layer EL and the second electrode E2 sequentially.

Such a first light emitting area EA1 may be surrounded by the first non-light emitting area NEA1.

The first light emitting area NEA1 may correspond to an area in which the BANK overlaps the flat portion CONP of the concave portion. Specifically, the first light emitting area NEA1 may correspond to an area in which the first part (P1) of the BANK overlaps the flat portion CONP of the concave portion CON.

The first non-light emitting area NEA1 may be an area formed because some L3 of light emitted from the organic layer EL travels to an area corresponding to the first part P1 of the bank BANK, but the traveled light is not extracted to outside of the panel. In other words, the first non-light emitting area NEA1 may be an area in which although light emitted from the organic layer EL travels in a direction parallel to the flat portion CONP and reaches the first electrode E1, but the light is trapped inside the subpixel because the light is not reflected enough to allow the light to be extracted to the outside, from the first electrode E1.

The second light emitting area EA2 may be disposed to surround the first non-light emitting area NEA1. The second light emitting area EA2 may be an area corresponding to an area in which the first electrode E1 overlaps the inclined portion CONS of the concave portion CON. In other words, the second light emitting area EA2 may be an area corresponding to the second area A2 of the first electrode E1.

Some L2 (hereinafter, referred to as "second light") of light emitted from the organic layer EL may travel to an area corresponding to the second area A2 of the first electrode E1.

Specifically, the second light L2 reaches an area corresponding to a part of the second area (A2) of the first electrode E1 through the first part P1 of the bank BANK. The second light L2 reached the first electrode E1 is reflected from the first electrode E1 and then extracted to the outside through the first part P1 of the bank BANK, the organic layer EL and the second electrode E2. Thus, since the second light L2 is extracted to the outside, therefore, present is the second light emitting area EA2.

Meanwhile, the first non-light emitting area NEA1 disposed between the first light emitting area EA1 and the second light emitting area EA2 may be an area in which both visible light of the first light emitting area EA1 and visible light of the second light emitting area EA2 are present, but embodiments of the present disclosure are not limited thereto.

The second non-light emitting area NEA2 may be disposed to surround the second light emitting area EA2. The second non-light emitting area NEA2 may correspond to an area in which the second part P2 of the BANK is disposed.

In the organic light emitting display panel according to embodiments of the present disclosure, the bank BANK disposed in the inclined portion CONS of the concave portion CON and the inclined portion CONS of the concave portion CON may have a specific condition, in order to increase an amount of extracted light from the second light emitting area EA2.

Figure 6:
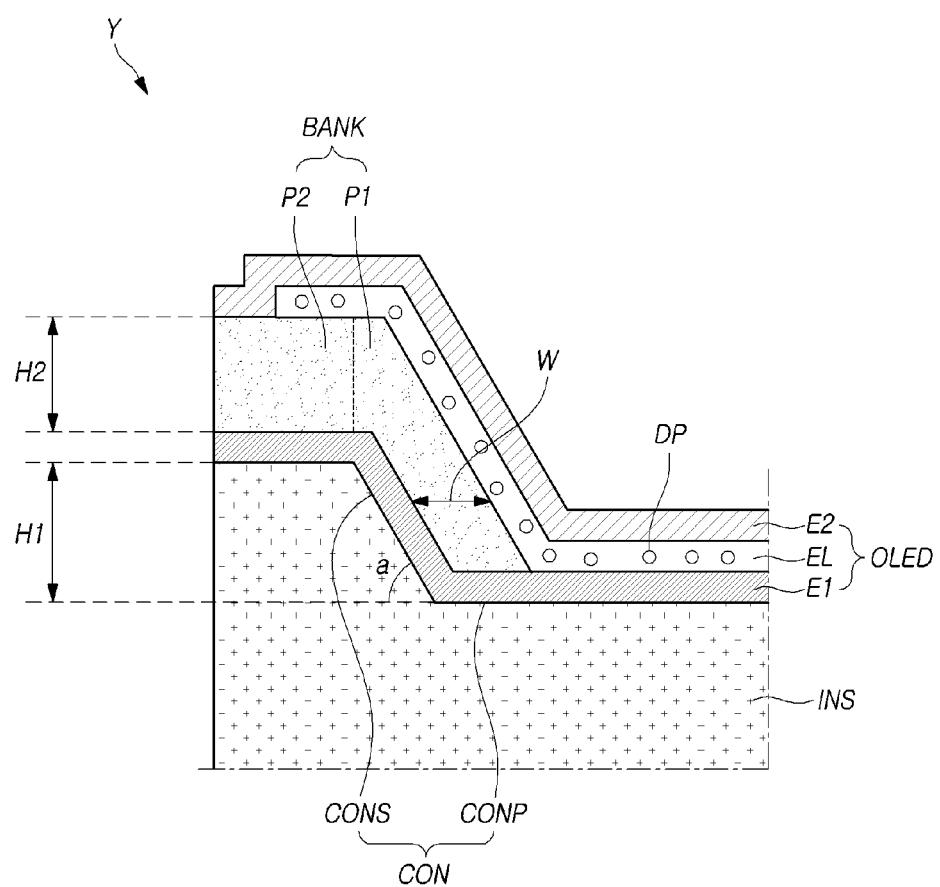
FIG. 6 is an expanded view of a Y portion in FIG. 4 to embodiments of the present disclosure.

Referring to FIG. 6, a height H1 (or a depth of the concave portion CON) of the inclined portion CONS of the insulating film INS may be greater than or equal to 0.7 μm. Here, the height H1 of the inclined portion CONS means the shortest distance from a line extending parallel to the surface of the substrate SUB in the surface of the flat portion CON of the concave portion CON to the side portion INSS.

Meanwhile, embodiments of the height H1 of the insulating film INS in which the inclined portion CONS of the concave portion CON is located are not limited to such a specific value. For example, a height H1 by which the concave portion CON of the insulating film INS does not expose configurations disposed on a lower portion of or under the insulating film INS is sufficient for the height of the insulating film INS.

The height H1 of the inclined portion CONS may be larger than the height H2 of the bank BANK disposed on the side portion INSS of the concave portion CON. In other words, the height H1 of the inclined portion CONS may be larger than the height H2 of the second part P2 of the bank BANK.

Thus, the larger the height H1 of the inclined portion CONS is, the greater an amount of reflected light from the second area A2 of the first electrode E1 is. Therefore, light extraction efficiency may be enhanced.

In addition, an angle A of the inclined portion CONS of the concave portion CON to the horizon or the surface of the substrate may be greater than or equal to 27° to less than 80°.

In case the angle is less than 27°, light emitted from the organic layer EL does not reach the first electrode E1 located on the inclined portion CONS, and therefore, the light travels toward adjacent one or more other subpixels and mixed with other colors, or is trapped inside the panel PNL and cannot be extracted to outside of the panel.

In case the angle A is larger than 80°, disconnection may occur in the configuration of the first electrode E1, etc. disposed on the inclined portion CONS of the insulating film INS.

In addition, a distance W between a surface of the first electrode E1 (a reflective electrode), such as the upper surface, and the bank BANK, such as the upper surface thereof, may be less than or equal to 3.2 μm, 2.6 μm, or 2.0 μm in an area corresponding to the inclined portion CONS of the concave portion CON.

In other words, the distance W between the surface of the first electrode and the bank BANK may be less than or equal to 3.2 μm, 2.6 μm, or 2.0 μm in the second area A2 of the first electrode E1.

As the distance W is smaller, the size of the first light emitting area EA1 can be increased, and light extraction efficiency can be enhanced because a distance that light reflected from the second area A2 of the first electrode E1 is extracted to the outside reduces. Accordingly, embodiments of the lower limit of the value of the distance W are not limited to such specific values. The lower limit of the value of the distance W may be preferably larger than or equal to 0.1 μm, 0.3 μm, or 0.5 μm.

By adjusting the range of the distance W as described above, it is possible to provide the organic light emitting display panel for enabling the size of the first light emitting area EA1 to be increased and light extraction efficiency to be enhanced.

Meanwhile, the second light L2 that has reached an area corresponding to a part of the second area A of the first electrode E1, among light emitted from the organic layer EL travels through the bank BANK twice until the second light L2 is extracted to the outside.

However, since the bank BANK can absorb light in the short wavelength range of the wavelength range of visible light, a color coordinate of the second light emitting area EA2 in which the second light L2 is extracted may be different from a color coordinate of the first light emitting area EA1 in which the first light L1 is extracted to the outside without traveling through the bank BANK. For example, a color coordinate of the second light emitting area EA2 may shift to a longer wavelength than a color coordinate of the first light emitting area EA1. As a result, colors of the first and second light emitting areas EA1 and EA2 may be mixed, and therefore, a color gamut may not be satisfied.

However, the organic light emitting display panel according to embodiments of the present disclosure may include at least one type of light emitting dopant DP with a maximum emission wavelength of 457 nm or less and/or with a full width at half maximum (FWHM) of 30 nm or less in a light emitting layer of the organic layer disposed in at least one blue subpixel.

Figure 7:
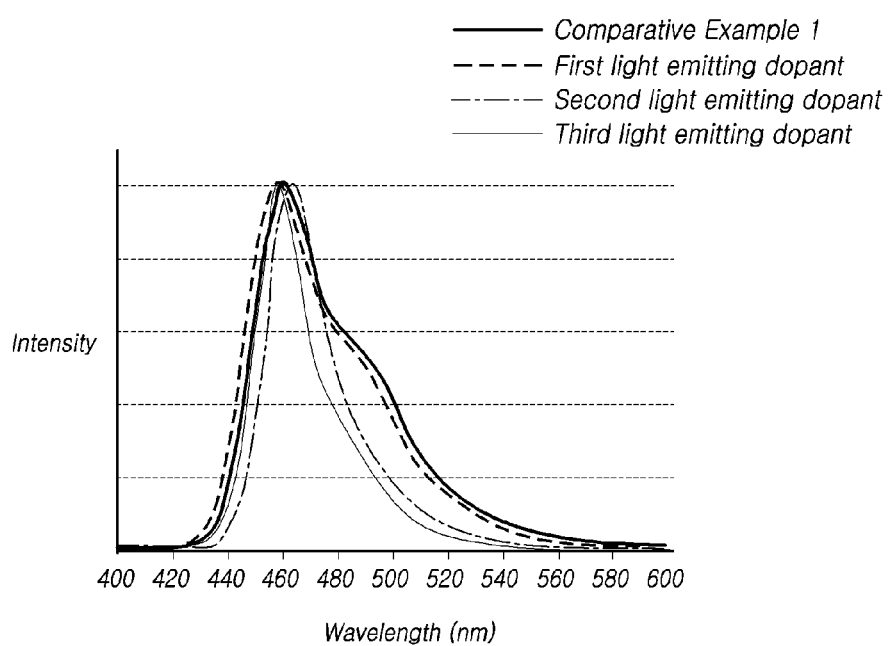

Specifically, at least one of a first to third light emitting dopants described in FIGS. 7 and 8 may be included in the light emitting layer of the organic layer disposed in at least one blue subpixel. In some embodiments, at least one of a first to third light emitting dopants may be disposed in a partial area of the organic layer EL, the area overlapping the inclined portion of the insulating film.

FIGS. 7 and 8 are views illustrating characteristics of light emitting dopants applicable to the light emitting layer of the organic light emitting display panel according to embodiments of the present disclosure.

Referring to FIGS. 7 and 8, at least one of the first to third light emitting dopants may be included in the light emitting layer of the organic layer EL of the organic light emitting display panel according to embodiments of the present disclosure.

A maximum emission wavelength of the first light emitting dopant may be 457 nm or less. A full width at half maximum (FWHM) of the second light emitting dopant may be 30 nm or less. A maximum emission wavelength of the third light emitting dopant may be 457 nm and a full width at half maximum (FWHM) may be 30 nm or less.

At least one of the first to third light emitting dopants may be included in the organic layer EL disposed in the blue subpixel.

Meanwhile, a light emitting dopant in Comparative Example 1 may have a maximum emission wavelength exceeding 457 nm and a full width at half maximum exceeding 30 nm.

In case a light emitting dopant in the Comparative Example 1 is applied to the organic light emitting display device, a color coordinate of the panel may shift toward a longer wavelength, and thus, a color gamut may be decreased.

Discussed below is a difference in the characteristics in the DCI-P3 color space between an organic light emitting display panel to which one of the first to third light emitting dopants is applied and an organic light emitting display panel to which at least one of the light emitting dopants according to embodiments of the present disclosure is not applied, that is, the light emitting dopant of the Comparative Example 1 is applied.

Figure 9:
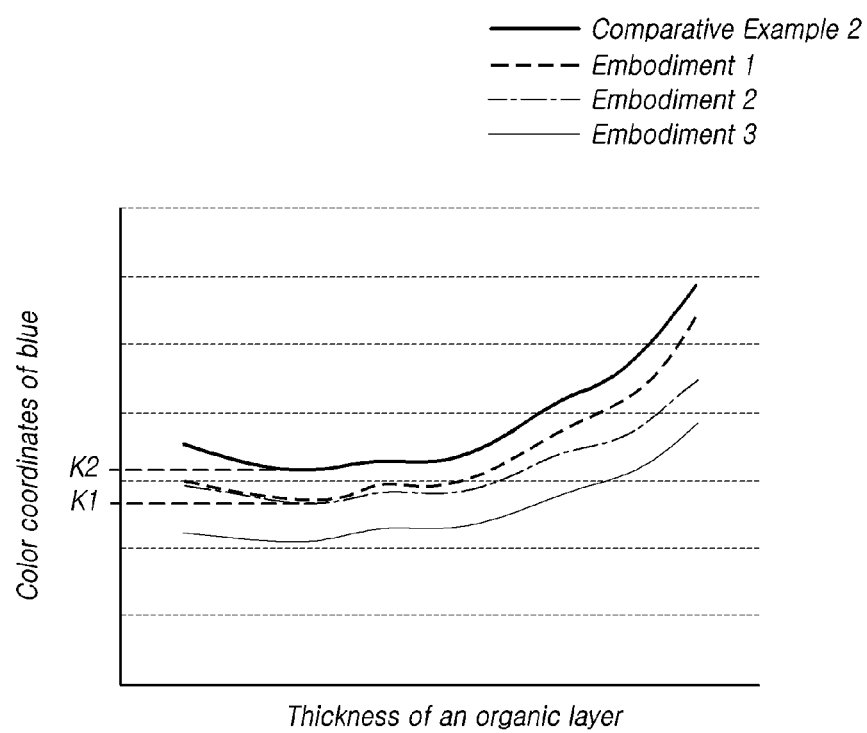
FIGS. 9 and 10 are graphs showing a difference in the characteristics of blue light in the Digital Cinema Initiatives P3 (DCI-P3) color space (e.g., color gamut) between an organic light emitting display panel including one of a first to third light emitting dopants and an organic light emitting display panel not including any light emitting dopant, according to embodiments of the present disclosure.
Figure 10:
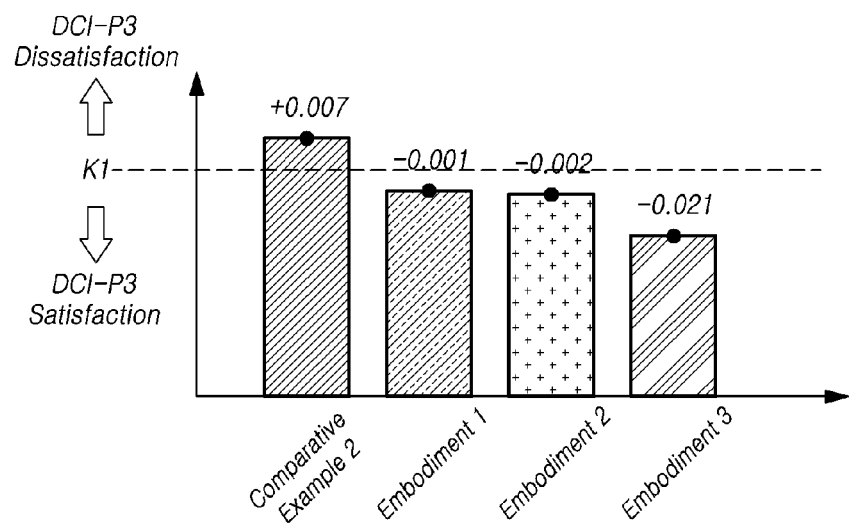

FIGS. 9 and 10 are graphs showing a difference in the characteristics of blue light in the DCI-P3 color space between the organic light emitting display panel including one of the first to third light emitting dopants and the organic light emitting display panel including the light emitting dopant of the Comparative Example 1.

In FIGS. 9 and 10, Comparative Example 2 is an organic light emitting display panel including the light emitting dopant of the Comparative Example 1. Embodiment 1 is an organic light emitting display panel including the first light emitting dopant in the light emitting layer disposed in the blue subpixel according to embodiments of the present disclosure. Embodiment 2 is an organic light emitting display panel including the second light emitting dopant in the light emitting layer disposed in the blue subpixel according to embodiments of the present disclosure. Embodiment 3 is an organic light emitting display panel including the third light emitting dopant in the light emitting layer disposed in the blue subpixel according to embodiments of the present disclosure.

In the graph of FIG. 9, the horizontal axis indicates thicknesses of organic layers, and the vertical axis indicates blue color coordinates in the DCI-P3 color space.

In order to satisfy an excellent color gamut of the organic light emitting display panel, it is necessary for a minimum value of a blue color coordinate to be below the value of K1.

However, referring to FIG. 9, the organic light emitting display panel of the Comparative Example 2 shows that the minimum value of the blue color coordinates does not fall below the value of K2.

In the Comparative Example 2, light with a short wavelength of light emitted from the organic light emitting display panel is shifted to a long wavelength, thus, resulting in a poor color gamut.

On the other hand, the organic light emitting display panels of Embodiments 1 to 3 of the present disclosure show that the minimum values of the blue color coordinates fall to the value of K1 or less, thereby exhibiting an excellent color gamut.

Here, the value of K1 may be 0.056 and the value of K2 may be 0.067.

In addition, in FIG. 10, the horizontal axis indicates Comparative Example 2, Embodiment 1, Embodiment 2 and Embodiment 3, and the vertical axis represents whether the DCI-P3 is satisfactory based on the value of K1.

Referring to FIG. 10, the organic light emitting display panel of the Comparative Example 2 has the blue color coordinate larger than the value of K1. That is, the organic light emitting display panel of the Comparative Example 2 does not satisfy the DCI-P3.

On the other hand, the organic light emitting display panels of the Embodiments 1 to 3 has the blue color coordinate less than the value of K1. That is, the organic light emitting display panels of the Embodiments 1 to 3 satisfy the DCI-P3.

In particular, each of the blue color coordinates of the organic light emitting display panels of the Embodiments 1 to 3 may be smaller by 0.009, 0.01, or 0.021 than that of the organic light emitting display panel of the Comparative Example 2.

That is, in the organic light emitting display panels according to the Embodiments 1 to 3 of the present disclosure, at least one of the first to third light emitting dopants is included in a light emitting layer of at least one blue subpixel, and therefore, it is possible to provide the organic light emitting display panel with an excellent color gamut.

This means that the color coordinate of the first light emitting area EA1 corresponds to (i.e., matches) the color coordinate of the second light emitting area EA2. In other words, a variance in color coordinate of the second light L2 extracted from the second light emitting area EA2 may not be caused by the bank BANK. That is, even when the bank BANK absorbs some with a short wavelength of the second light L2, since at least one of the first to third light emitting dopants is included in the light emitting layer of at least one blue subpixel, it is possible to prevent a color of the second light emitting area EA2 from shifting to a long wavelength.

The organic light emitting display panel according to embodiments of the present disclosure may include at least one type of light emitting dopant DP with a maximum emission wavelength of 522 nm or less and/or with a full width at half maximum (FWHM) of 60 nm or less in a light emitting layer of the organic layer disposed in at least one green subpixel.

Figure 11:
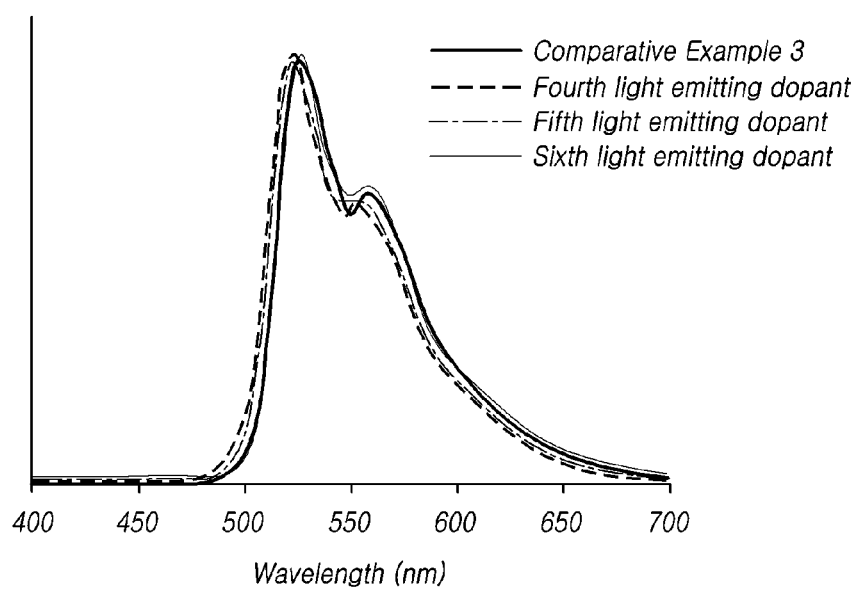

Specifically, at least one of fourth to sixth light emitting dopants described in FIGS. 11 and 12 may be included in the light emitting layer of the organic layer disposed in at least one green subpixel.

FIGS. 11 and 12 are views illustrating characteristics of light emitting dopants applicable to the light emitting layer of the organic light emitting display panel according to embodiments of the present disclosure.

Referring to FIGS. 11 and 12, at least one of the fourth to sixth light emitting dopants may be included in the light emitting layer of the organic layer EL of the organic light emitting display panel according to embodiments of the present disclosure. In some embodiments, at least one of a fourth to sixth light emitting dopants may be disposed in a partial area of the organic layer EL, the area overlapping the inclined portion of the insulating film A maximum emission wavelength of the fourth light emitting dopant may be 522 nm or less and a full width at half maximum (FWHM) of the fourth light emitting dopant may be 64 nm or less. A maximum emission wavelength of the fifth light emitting dopant may be 526 nm or less and a full width at half maximum (FWHM) of the fifth light emitting dopant may be 62 nm or less. A maximum emission wavelength of the sixth light emitting dopant may be 522 nm or less and a full width at half maximum (FWHM) of the sixth light emitting dopant may be 62 nm or less.

At least one of the fourth to sixth light emitting dopants may be included in the organic layer EL disposed in the green subpixel.

Meanwhile, a light emitting dopant in Comparative Example 3 may have a maximum emission wavelength exceeding 522 nm and a full width at half maximum (FWHM) may be exceeding 64 nm.

In case a light emitting dopant in the Comparative Example 3 is applied to the organic light emitting display device, a color coordinate of the panel may shift toward a longer wavelength, and thus, a color gamut may be decreased.

Discussed below is a difference in the characteristics in the DCI-P3 color space between an organic light emitting display panel to which one of the fourth to sixth light emitting dopants is applied and an organic light emitting display panel to which at least one of the light emitting dopants according to embodiments of the present disclosure is not applied, that is, the light emitting dopant of the Comparative Example 3 is applied.

Figure 13:
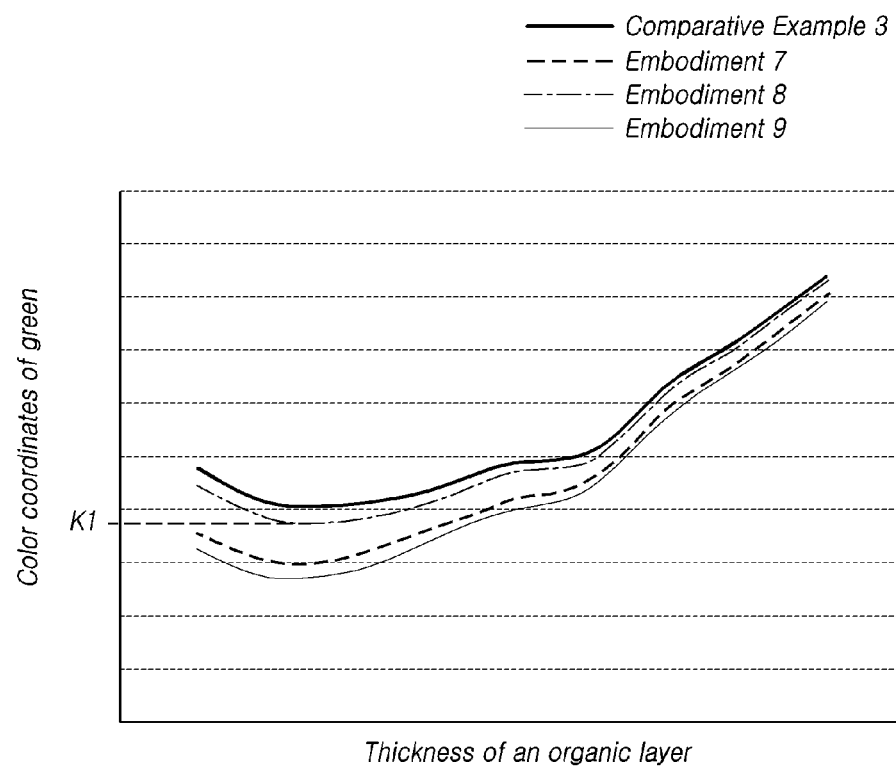
FIGS. 13 and 14 are graphs showing a difference in the characteristics of green light in the Digital Cinema Initiatives P3 (DCI-P3) color space (e.g., color gamut) between an organic light emitting display panel including one of a fourth to sixth light emitting dopants and an organic light emitting display panel not including any light emitting dopant, according to embodiments of the present disclosure.
Figure 14:
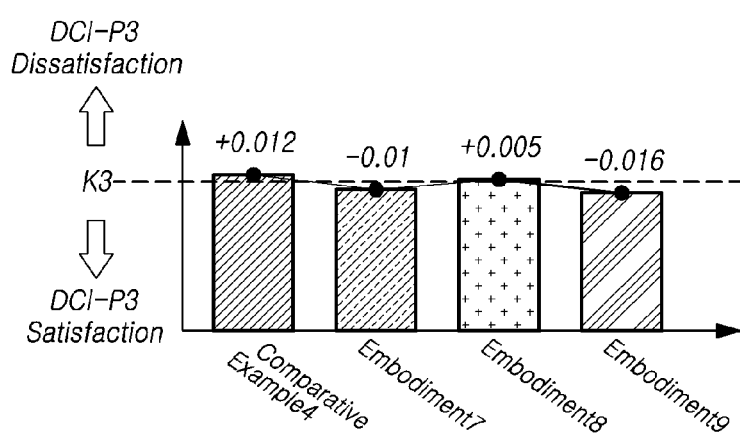

FIGS. 13 and 14 are graphs showing a difference in the characteristics of green light in the DCI-P3 color space between the organic light emitting display panel including one of the fourth to sixth light emitting dopants and the organic light emitting display panel including the light emitting dopant of the Comparative Example 3.

In FIGS. 13 and 14, Comparative Example 4 is an organic light emitting display panel including the light emitting dopant of the Comparative Example 3. Embodiment 7 is an organic light emitting display panel including the fourth light emitting dopant in the light emitting layer disposed in the green subpixel according to embodiments of the present disclosure. Embodiment 8 is an organic light emitting display panel including the fifth light emitting dopant in the light emitting layer disposed in the green subpixel according to embodiments of the present disclosure. Embodiment 9 is an organic light emitting display panel including the sixth light emitting dopant in the light emitting layer disposed in the green subpixel according to embodiments of the present disclosure.

In the graph of FIG. 13, the horizontal axis indicates thicknesses of organic layers, and the vertical axis indicates green color coordinates in the DCI-P3 color space.

In order to satisfy an excellent color gamut of the organic light emitting display panel, it is necessary for a minimum value of a green color coordinate to be below the value of K3.

However, referring to FIG. 13, the organic light emitting display panel of the Comparative Example 4 and Embodiment 8 of the present disclosure show that the minimum value of the green color coordinates does not fall below the value of K3.

In the Comparative Example 4 and Embodiment 8 of the present disclosure, light with a short wavelength of light emitted from the organic light emitting display panel is shifted to a long wavelength, thus, resulting in a poor color gamut.

On the other hand, the organic light emitting display panels of Embodiments 7 and 9 of the present disclosure show that the minimum values of the green color coordinates fall to the value of K3 or less, thereby exhibiting an excellent color gamut.

Here, the value of K3 may be 0.220.

In addition, in FIG. 14, the horizontal axis indicates Comparative Example 4, Embodiment 7, Embodiment 8 and Embodiment 9, and the vertical axis represents whether the DCI-P3 is satisfactory based on the value of K3.

Referring to FIG. 14, the organic light emitting display panel of the Comparative Example 4 and Embodiment 8 has the green color coordinate larger than the value of K3. That is, the organic light emitting display panel of the Comparative Example 4 and Embodiment 8 do not satisfy the DCI-P3.

On the other hand, the organic light emitting display panels of the Embodiments 7 and 9 has the green color coordinate less than the value of K3. That is, the organic light emitting display panels of the Embodiments 7 and 9 satisfy the DCI-P3.

In particular, each of the green color coordinates of the organic light emitting display panels of the Embodiments 7 and 9 may be smaller by 0.01 or 0.016 than the value of K3 and each of the green color coordinates of the organic light emitting display panels of the Comparative Example 4 and Embodiment 8 may be lager by 0.012 or 0.005 than the value of K3.

That is, in the organic light emitting display panels according to the Embodiments 7 and 9 of the present disclosure, at least one of the fourth and sixth light emitting dopants (i.e., a maximum emission wavelength of the light emitting dopant may be 522 nm or less) is included in a light emitting layer of at least one green subpixel, and therefore, it is possible to provide the organic light emitting display panel with an excellent color gamut.

This means that the color coordinate of the first light emitting area EA1 corresponds to (i.e., matches) the color coordinate of the second light emitting area EA2. In other words, a variance in color coordinate of the second light L2 extracted from the second light emitting area EA2 may not be caused by the bank BANK. That is, even when the bank BANK absorbs some with a short wavelength of the second light L2, since at least one of the fourth and sixth light emitting dopants is included in the light emitting layer of at least one green subpixel, it is possible to prevent a color of the second light emitting area EA2 from shifting to a long wavelength.

Meanwhile, the organic light emitting display panel according to embodiments of the present disclosure may further include a capping layer on the second electrode E2 of the organic light emitting device OLED, such as an organic light emitting diode, etc. In this case, it is possible to enhance light extraction efficiency.

In the following description, such as illustrated in and described with respect to FIGS. 11 and 14, some configurations, effects etc. of the embodiments or examples discussed above may not be repeatedly described for convenience of description. That is, even when not discussed in the following description for convenience of description, one or more features, configurations, or structures described above in the embodiments or examples can be equally applied to or combined into each of the embodiments or examples described below. Any full or partial combination of one or more embodiments or examples herein is also part of the present disclosure.

Embodiments related to the capping layer are discussed below with reference to FIGS. 15 and 16.

Figure 15:
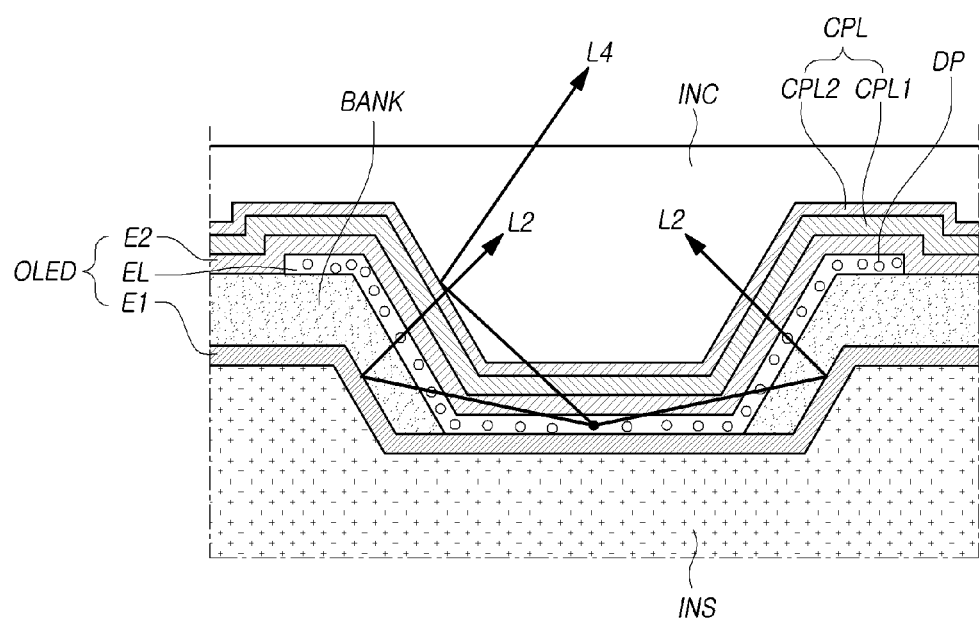
FIGS. 15 and 16 are sectional views illustrating a subpixel applied to an organic light emitting display panel according to another embodiment of the present disclosure.
Figure 16:
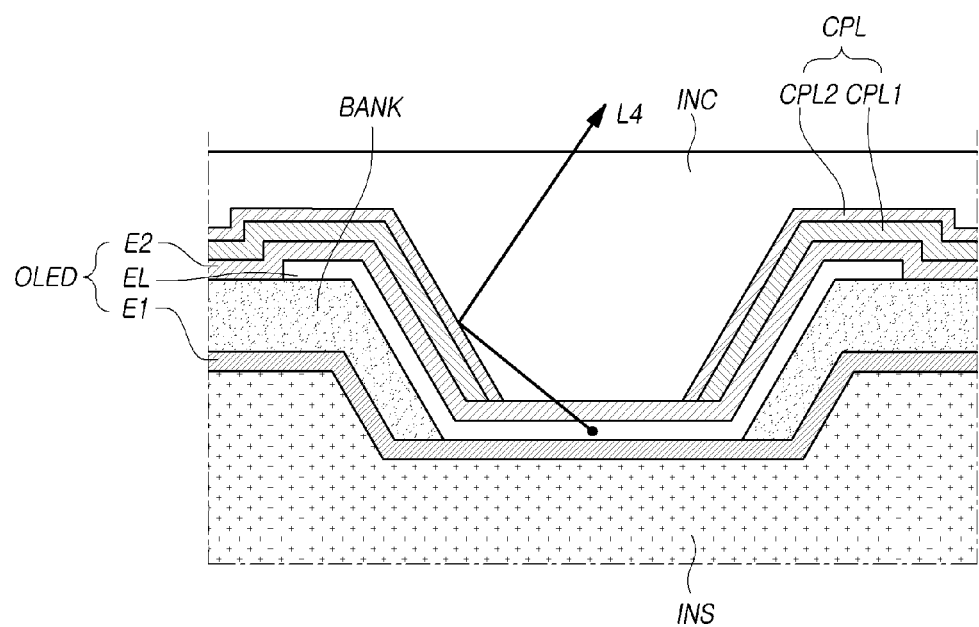

FIGS. 15 and 16 are sectional views illustrating a subpixel applied to the organic light emitting display panel according to embodiments of the present disclosure.

Subpixels shown in FIGS. 15 and 16 may be blue subpixels included in the organic light emitting display panel, but embodiments of the present disclosure are not limited thereto.

Referring to FIG. 15, in the organic light emitting display panel according to embodiments of the present disclosure, the organic layer EL may extend from the concave portion CON and be disposed on a part of the side portion INSS.

In this case, the organic light emitting display panel may be configured with one or more subpixels having at least three different colors. For example, the organic light emitting display panel may be configured with subpixels emitting red, green and blue light.

It is noted that characteristics or configurations for disposing an organic layer EL in the organic light emitting display panel according to embodiments of the present disclosure are not limited thereto, and the organic layer EL may be disposed to overlap all of the concave portion CON and the side portion INSS in the active area. One organic layer EL may be disposed commonly in at least two subpixels each emitting different light from the other.

In this case, the organic light emitting display panel may be configured with subpixels having at least two to four different colors.

For example, in case the organic light emitting display panel is configured with subpixels having four different colors, the organic light emitting display panel may be configured with subpixels emitting red, white, green, and blue light. In addition, another substrate may be disposed to face the substrate SUB, and multiple color filters may be disposed over a surface of the other substrate. One or more light emitting dopants may be included in light emitting layers of subpixels having at least four different colors.

The organic layer EL may include at least one type of light emitting dopant DP with a maximum emission wavelength of 457 nm or less and/or with a full width at half maximum (FWHM) of 30 nm or less.

The second light L2 that has reached an area corresponding to a part of the second area A of the first electrode E1 (referring to FIG. 5) hasn't a variance in color coordinate since the organic layer EL includes at least one type of light emitting dopant DP.

The second electrode E2 may be disposed on the organic layer EL.

The capping layer CPL may be disposed on the second electrode EL.

The capping layer CPL includes a first capping layer CPL disposed on the second electrode EL and a second capping layer CPL disposed on the first capping layer CPL. The first capping layer CPL1 may be formed of an organic material, and the second capping layer CPL2 may be formed of an inorganic material.

An encapsulation layer INC may be disposed on the capping layer CPL.

FIG. 15 shows the encapsulation layer INC formed from a single layer, but embodiments of the present disclosure are not limited thereto. The encapsulation layer INC may be formed from multiple layers. In this case, an organic encapsulation layer and an inorganic encapsulation layer may be disposed alternately.

A refractive index of the encapsulation layer INC may be greater than that of the second capping layer CPL2. Accordingly, some L4 (hereinafter, referred to as "fourth light") of light emitted from the organic layer EL may be reflected from the interface between the second capping layer CPL2 and the encapsulation layer INC and then extracted to outside of the panel.

In particular, some of the fourth light L4 which travels to the second area A2 of the first electrode (E1) can be reflected from the interface between the second capping layer CPL2 and the encapsulation layer INS and then extracted to the outside before it reaches the second area A2 of the first electrode E1.

That is, the second capping layer CPL2 reduces an amount of light extracted to outside of the display panel after the light emitted from the organic layer EL has passed through the bank BANK, and prevents or reduces light having reached the second light emitting area EA2 from shifting to a longer wavelength than an initial wavelength of the light emitted from the organic layer EL.

Meanwhile, the capping layer CPL disposed in one blue subpixel is shown in and described with respect to FIG. 15, but embodiments of the present disclosure are not limited thereto. For example, the capping layer CPL disposed in a part of one blue subpixel is shown in and described with respect to FIG. 16.

Specifically, each of the first electrode E1, the organic layer EL and the second electrode E2 may include at least one inclined portion and at least one flat portion by the inclined portion CONS and the flat portion CONP of the concave portion CON. That is, the inclined portion CONS and the flat portion CONP of each of the first electrode E1, the organic layer EL and the second electrode E2 may include areas overlapping the inclined portion CONS and the flat portion CONP of the concave portion CON, respectively.

Furthermore, each of the first electrode E1, the organic layer EL and the second electrode E2 may include at least one side portion formed by, or corresponding to, the side portion INSS surrounding the concave portion CON. In other words, the side portion of each of the first electrode E1, the organic layer EL and the second electrode E2 may be a side portion overlapping the side portion INSS surrounding the concave portion CON.

In some embodiments, the capping layer CPL may be disposed only in an area in which an inclined surface of the second electrode E2 disposed beneath the capping layer CPL overlaps the side portion of each of the first electrode E1, the organic layer EL and the second electrode E2 without overlapping the flat portion of the first electrode E1 as shown in FIG. 12.

Through this, before reaching a second area of the first electrode E1, some of the fourth light emitted from the organic layer can be reflected from the interface between the second capping layer CPL2 and the encapsulation layer INS, and then extracted to outside of the display panel.

Here, a thickness of the second electrode E2 may be from 50 Å to 250 Å. A thickness of first capping layer CPL1 may be from 100 Å to 2000 Å. A thickness of second capping layer CPL2 may be from 100 Å to 1000 Å.

Meanwhile, the capping layer may be formed from a multilayer with the first and second capping layers CPL1 and CPL2 in the blue subpixel, as shown in FIGS. 15 and 16; however, embodiments of the present disclosure are not limited thereto.

For example, the capping layer CPL may be employed in all or any subpixels arranged in the active area.

Figure 17:
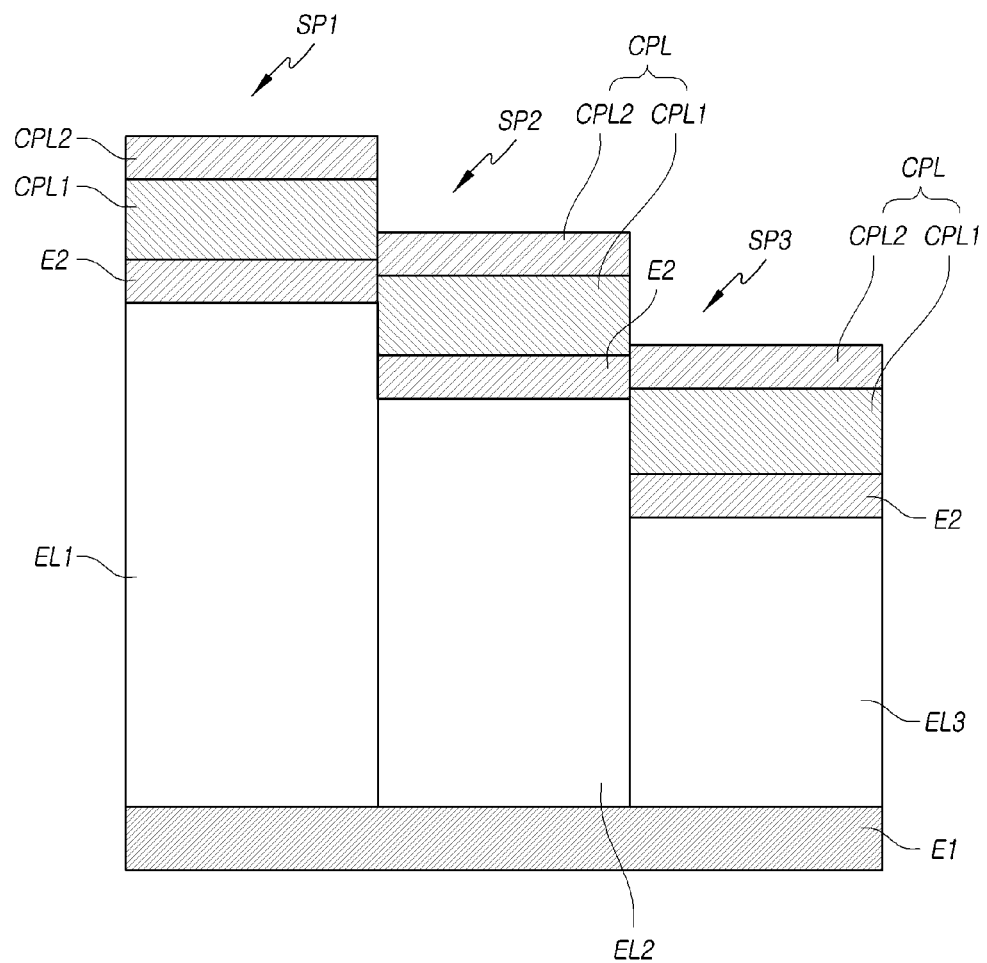
FIG. 17 is a view illustrating that a capping layer is applicable to all subpixels in the active area of the organic light emitting display panel according to another embodiment of the present disclosure.

FIG. 17 is a view illustrating that a capping layer is applicable to all subpixels in the active area of the organic light emitting display panel according to embodiments of the present disclosure.

Referring to FIG. 17, the organic light emitting display device may include a plurality of first to third subpixels SP1, SP2 and SP3.

The first subpixel SP1 may by a red subpixel. The second subpixel SP2 may be a green subpixel. The third subpixel SP3 may be a blue subpixel.

Meanwhile, the organic layers EL1, EL2 and EL3 may differ according to a color of emitted light, as shown in FIG. 17; however, embodiments of the present disclosure are not limited thereto.

The first and second capping layers CPL1 and CPL2 may be applied to all of the first to third subpixels SP1, SP2 and SP3.

Thus, before some of light emitted from the organic layers EL1, EL2 and EL3 in all subpixels SP1, SP2 and SP3 reaches the second area of the first electrode E1, it can be reflected from the interface between the second capping layer CPL2 and the encapsulation layer INS, and then extracted to outside of the display panel. Accordingly, light emitted from each subpixel can be prevented from shifting to a longer wavelength than an initial wavelength of the light emitted from each subpixel.

In addition, the organic layer EL3 disposed in at least one blue subpixel employing the first and second capping layers CPL1 and CPL2 may include at least one of the first to third light emitting dopants. Also, the organic layer EL3 disposed in at least one green subpixel employing the first and second capping layers CPL1 and CPL2 may include at least one of the fourth to sixth light emitting dopants.

Through this, it is possible to enhance a color gamut of the organic light emitting display panel.

This effect is discussed in detail below with reference to FIGS. 18 and 19.

Figure 18:
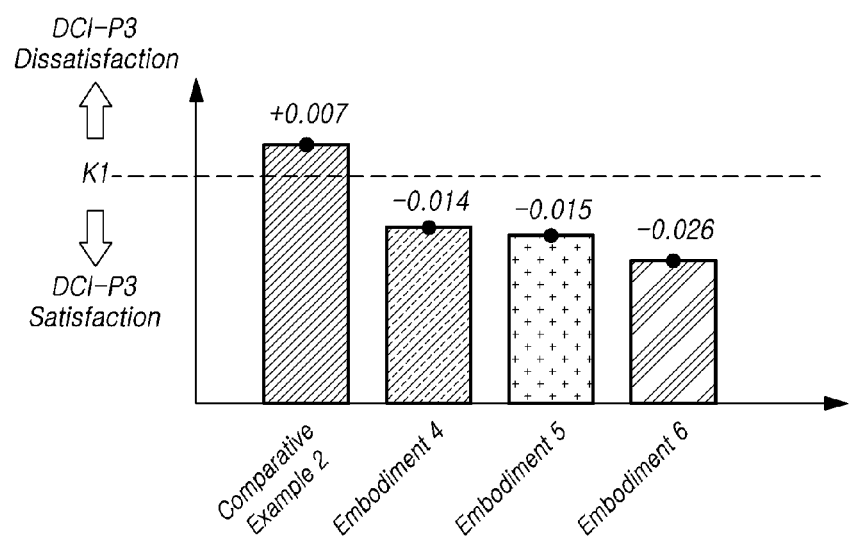
FIG. 18 is a graph showing a difference in the characteristics of blue light in the DCI-P3 color space (e.g., color gamut) between an organic light emitting display panel which includes one of a first to third light emitting dopants, to which the capping layer of FIG. 17 is applied, and an organic light emitting display panel which does not include any light emitting dopant according to embodiments of the present disclosure, to which the capping layer is not applied.

FIG. 18 is a graph showing a difference in the characteristics of blue light in the DCI-P3 color space between an organic light emitting display panel including one of the first to third light emitting dopants and the capping layer of FIG. 17 and an organic light emitting display panel not including the capping layer.

In FIG. 14, Comparative Example 2 is an organic light emitting display panel including the light emitting dopant of the Comparative Example 1. Embodiment 4 is an organic light emitting display panel including the first light emitting dopant in the light emitting layer disposed in the blue subpixel according to embodiments of the present disclosure, and including the capping layer of FIG. 17. Embodiment 5 is an organic light emitting display panel including the second light emitting dopant in the light emitting layer disposed in the blue subpixel according to embodiments of the present disclosure, and including the capping layer of FIG. 17. Embodiment 6 is an organic light emitting display panel including the third light emitting dopant in the light emitting layer disposed in the blue subpixel according to embodiments of the present disclosure, and including the capping layer of FIG. 17.

In addition, in FIG. 18, the horizontal axis indicates Comparative Example 2, Embodiment 4, Embodiment 5 and Embodiment 6, and the vertical axis represents whether the DCI-P3 is satisfactory based on the value of K1.

Referring to FIG. 18, the organic light emitting display panel of the Comparative Example 2 has a blue color coordinate larger than the value of K1. That is, the organic light emitting display panel of the Comparative Example 2 does not satisfy the DCI-P3.

On the contrary, the organic light emitting display panels of the Embodiments 4 to 6 have blue color coordinates smaller than the value of K1. That is, the organic light emitting display panels of the Embodiments 4 to 6 satisfy the DCI-P3.

In particular, each of the blue color coordinates of the organic light emitting display panels of the Embodiments 4 to 6 may be smaller by 0.014, 0.015, or 0.026 than that of the organic light emitting display panel of the Comparative Example 2.

That is, in the organic light emitting display panels according to the Embodiments 4 to 6 of the present disclosure, at least one of the first to third light emitting dopants is included in a light emitting layer of at least on blue subpixel, and the capping layer of FIG. 17 is employed in a light emitting layer of at least one blue subpixel, and therefore, it is possible to provide the organic light emitting display panel with an excellent color gamut.

Figure 19:
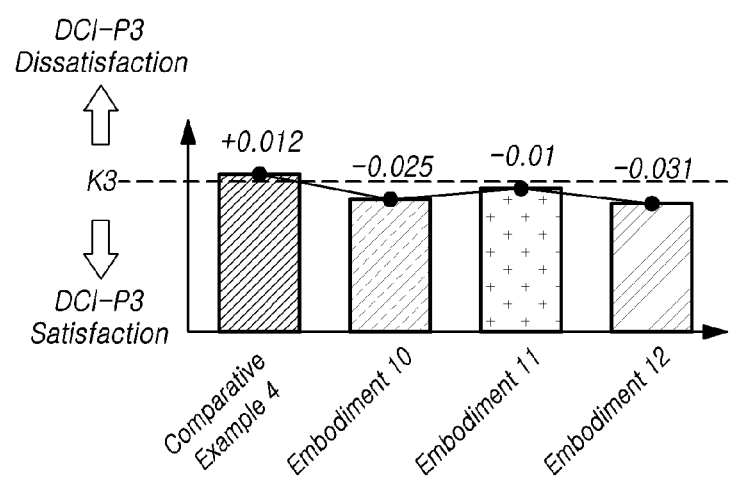
FIG. 19 is a graph showing a difference in the characteristics of green light in the DCI-P3 color space (e.g., color gamut) between an organic light emitting display panel which includes one of a fourth to sixth light emitting dopants, to which the capping layer of FIG. 17 is applied, and an organic light emitting display panel which does not include any light emitting dopant according to embodiments of the present disclosure, to which the capping layer is not applied.

FIG. 19 is a graph showing a difference in the characteristics of green light in the DCI-P3 color space between an organic light emitting display panel including one of the fourth to sixth light emitting dopants and the capping layer of FIG. 17 and an organic light emitting display panel not including the capping layer.

In FIG. 19, Comparative Example 4 is an organic light emitting display panel including the light emitting dopant of the Comparative Example 3. Embodiment 10 is an organic light emitting display panel including the fourth light emitting dopant in the light emitting layer disposed in the green subpixel according to embodiments of the present disclosure, and including the capping layer of FIG. 17. Embodiment 11 is an organic light emitting display panel including the fifth light emitting dopant in the light emitting layer disposed in the green subpixel according to embodiments of the present disclosure, and including the capping layer of FIG. 17. Embodiment 12 is an organic light emitting display panel including the sixth light emitting dopant in the light emitting layer disposed in the green subpixel according to embodiments of the present disclosure, and including the capping layer of FIG. 17.

In addition, in FIG. 19, the horizontal axis indicates Comparative Example 4, Embodiment 10, Embodiment 11 and Embodiment 12, and the vertical axis represents whether the DCI-P3 is satisfactory based on the value of K3.

Referring to FIG. 19, the organic light emitting display panel of the Comparative Example 4 has a green color coordinate larger than the value of K3. That is, the organic light emitting display panel of the Comparative Example 4 does not satisfy the DCI-P3.

On the contrary, the organic light emitting display panels of the Embodiments 10 to 12 have green color coordinates smaller than the value of K3. That is, the organic light emitting display panels of the Embodiments 10 to 12 satisfy the DCI-P3.

In particular, each of the green color coordinates of the organic light emitting display panels of the Embodiments 10 to 12 may be smaller by 0.025, 0.01, or 0.031 than that of the organic light emitting display panel of the Comparative Example 4.

That is, in the organic light emitting display panels according to the Embodiments 10 to 12 of the present disclosure, at least one of the fourth to sixth light emitting dopants is included in a light emitting layer of at least one green subpixel, and the capping layer of FIG. 17 is employed in a light emitting layer of at least one green subpixel, and therefore, it is possible to provide the organic light emitting display panel with an excellent color gamut.

On the other hand, the capping layer may move a full width at half maximum (FWHM) of the light emitting dopant to the lower side. For example, the capping layer may move the full width at half maximum (FWHM) of the light emitting dopant by −2 nm to −4 nm.

It can be seen that the organic light emitting display panel according to Embodiment 8 of FIG. 14 does not satisfy DCI-P3, but the organic light emitting display panel according to Embodiment 10 of FIG. 19 including the same light emitting dopant is satisfied DCI-P3.

This means that even if the maximum emission wavelength of the fifth light emitting dopant exceeds 522 nm, this is a phenomenon that occurs due to the full width at half maximum (FWHM) being lower than 60 nm or less due to the capping layer.

In other words, the capping layer may serve to move the full width at half maximum (FWHM) of the light emitting dopant. When the full width at half maximum (FWHM) of the light-emitting dopant included in the light-emitting layer is 60 nm or less, it is possible to realize excellent color reproduction of the organic light emitting display panel.

An organic light emitting display panel according to another embodiment of the present disclosure is discussed with reference to FIG. 20.

In the following description, such as illustrated in and described with respect to FIGS. 20 and 21, some configurations, effects etc. of the embodiments or examples discussed above may not be repeatedly described for convenience of description. That is, even when not discussed in the following description for convenience of description, one or more features, configurations, or structures described above in the embodiments or examples can be equally applied to or combined into each of the embodiments or examples described below. Any full or partial combination of one or more embodiments or examples herein is also part of the present disclosure.

Figure 20:
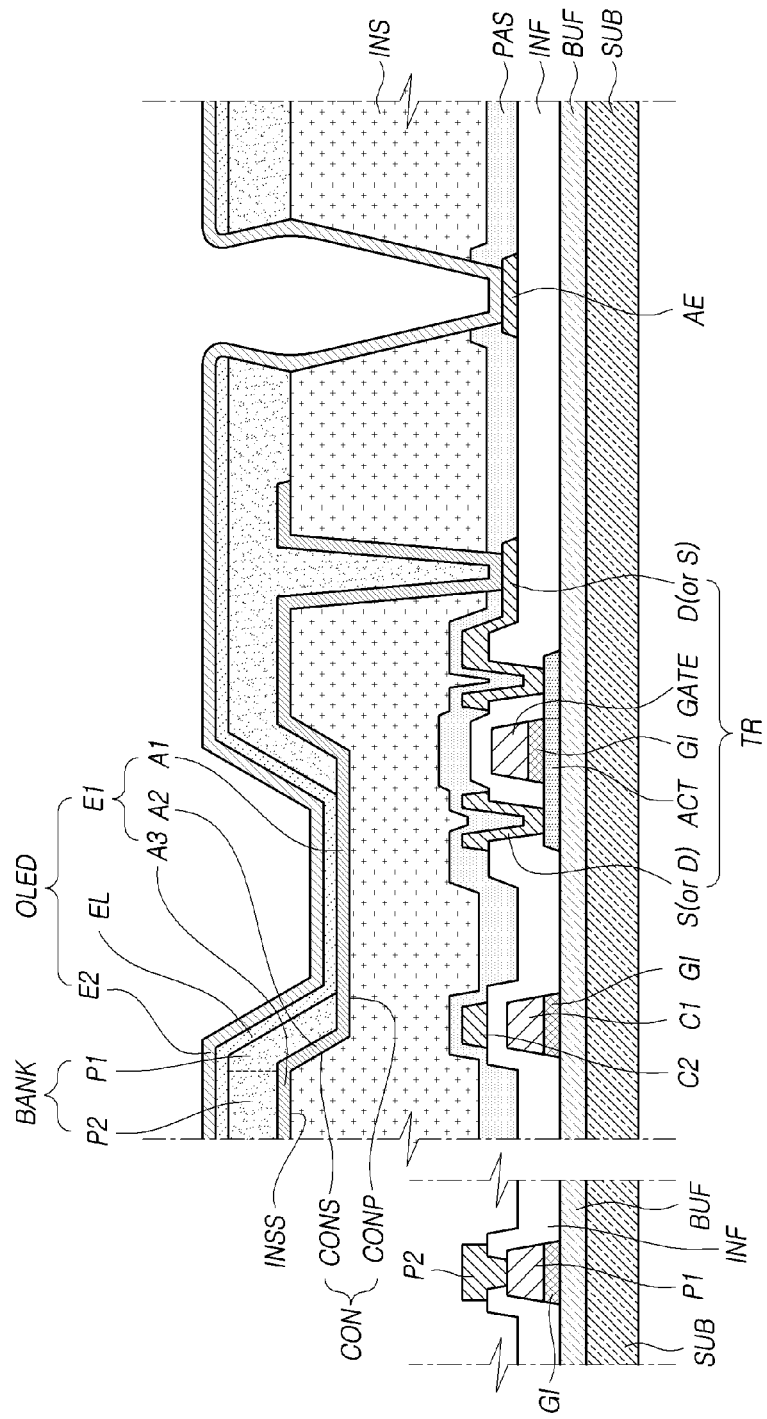
FIG. 20 is a sectional view illustrating an organic light emitting display panel according to further another embodiment of the present disclosure.

In FIG. 20, unlike the structure of FIG. 4, an organic layer EL of an organic light emitting device OLED may be disposed on the whole surface of the active area A/A.

In this case, for contact between a second electrode E2 and an auxiliary electrode AE, a bank BANK may have a structure that prevents a material of the organic layer EL from being deposited on the auxiliary electrode AE in the process of forming the organic layer EL.

Specifically, as shown in FIG. 20, as the bank BANK is moved away from the substrate SUB, the bank BANK may have a shape that becomes gradually wider, in an area surrounding a hole formed for not covering the auxiliary AE. That is, as the bank BANK is moved away from the substrate SUB, the hole entrance of the bank BANK that exposes the auxiliary electrode AE may be narrower.

Meanwhile, a process of forming the organic layer EL may be performed by a vapor deposition or coating method in which a raw material has straightness. For example, an evaporation method may be used. In addition, a process of forming a second electrode EL2 may be performed by a vapor deposition or coating method in which directionality of a raw material is not constant. For example, a sputtering method may be used.

Since the entrance of the hole, which does not cover the auxiliary electrode AE, of the bank BANK is narrow, process characteristics of the organic layer EL may allow the organic layer EL not to be disposed on the auxiliary electrode AE. Further, even when the hole entrance of the bank BANK is narrow, process characteristics of the second electrode E2 may also allow a raw material of the second electrode E2 to be entered into the hole, and therefore, the second electrode E2 may be disposed on the auxiliary electrode AE.

Figure 21:
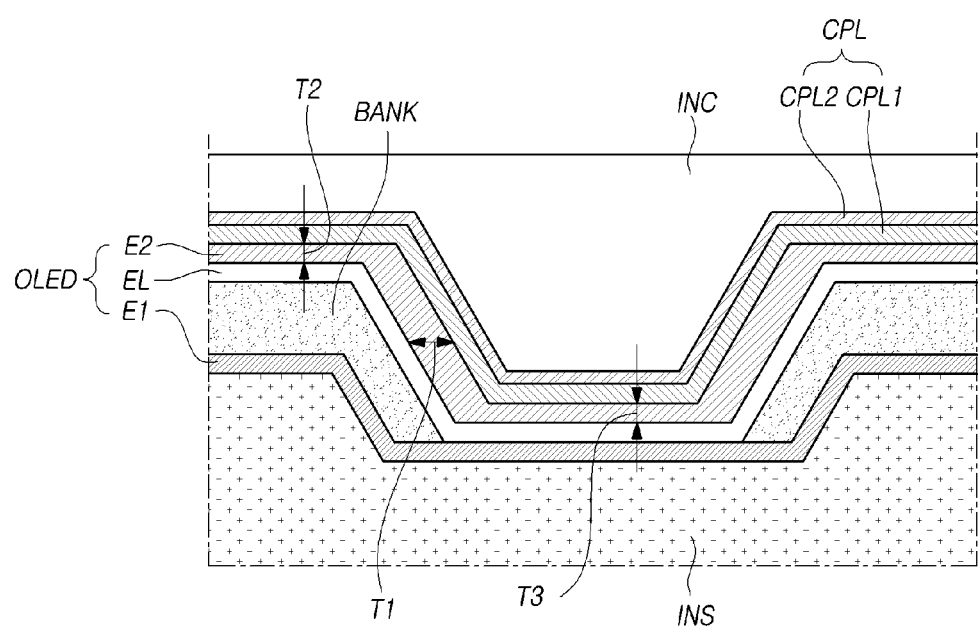
FIG. 21 is a sectional view illustrating an area of the organic light emitting display panel according to further another embodiment of the present disclosure.

FIG. 21 is a sectional view illustrating an area of an organic light emitting display panel according to further another embodiment of the present disclosure.

The organic light emitting display panel is discussed with reference to FIG. 21.

Referring to FIG. 21, in the organic light emitting display panel, a thickness of a second electrode E2 of an organic light emitting device OLED may be different according to locations.

Meanwhile, each of a first electrode E1 and an organic layer EL may include one inclined portion and one flat portion by an inclined portion CONS and a flat portion CONP of a concave portion CON. That is, the inclined portion CONS and the flat portion CONP of each of the first electrode E1 and the organic layer EL may include areas overlapping the inclined portion CONS and the flat portion CONP of the concave portion CON, respectively.

Furthermore, each of the first electrode E1 and the organic layer EL may include one side portion formed by, or corresponding to, a side portion INSS surrounding the concave portion CON. In other words, the side portion of each of the first electrode E1 and the organic layer EL may be a side portion overlapping the side portion INSS surrounding the concave portion CON.

At this time, the second electrode E2 may be disposed along, or corresponding to, a surface shape of the organic layer EL disposed beneath the second electrode E2.

A first thickness T1 of an area of the second electrode E2 corresponding to the inclined portion of the organic layer EL may be thicker than second and third thicknesses T2 and T3 of areas of the second electrode E2 corresponding to the flat portion of the organic layer EL and the side portion of the organic layer. Here, the thickness T1 of the second electrode E2 may be from 50 Å to 250 Å.

Meanwhile, the area in which the second electrode E2 has the first thickness T1 may overlap the second area A2 of the first electrode E1.

Thus, after light emitted from the organic layer EL has been reflected from the second area A2 of the first electrode E1, the light extracted to outside of the panel through the bank BANK, the organic layer EL, and the second electrode E2 may have a micro-cavity effect.

Here, the micro-cavity effect means a phenomenon that light is confined between the first electrode E1, which is a reflective electrode, and second electrode E2, which is a transflective electrode, is trapped with a specific wavelength, and amplified and emitted through the second electrode E2 area.

That is, since the thickness T1 of the second electrode E2 is larger than the thicknesses of the second and third thicknesses T2 and T3, therefore it is possible to enhance luminance of the second light emitting area EA2.

In accordance with embodiments of the present disclosure, in the active area, since the insulating film INS is configured with at least one concave portion CON, and the first electrode E1 of the organic light emitting device OLED including the reflective electrode is disposed on the concave portion CON, therefore, it is possible to provide an organic light emitting display panel and an organic light emitting display device having a structure for enhancing luminous efficiency.

In accordance with embodiments of the present disclosure, it is possible to provide organic light emitting display panels and organic light emitting display devices having a structure for preventing or reducing color mixing between adjacent subpixels.

In accordance with embodiment of the present disclosure, since the bank BANK having a thin thickness can be formed in an area corresponding to the inclined portion CONS of the concave portion CON, therefore, it is possible to provide an organic light emitting display panel and an organic light emitting display devices having a structure for reducing a distance that light emitted from the organic layer is extracted to outside of the display.

In accordance with embodiment of the present disclosure, since at least one blue subpixel includes at least one light emitting dopant, therefore, it is possible to provide an organic light emitting display panel and an organic light emitting display device having a structure in which color coordinates of one or more light emitting areas which emit an identical color correspond to one another.

In addition, since a thickness of the second electrode in a specific area is formed with a large value, or a capping layer formed of an inorganic material is employed in at least blue subpixel, therefore it is possible to provide an organic light emitting display panel and an organic light emitting display device having an excellent color gamut.

The features, structures, configurations, and effects described in the present disclosure are included in at least one embodiment but are not necessarily limited to a particular embodiment. A person skilled in the art can apply the features, structures, configurations, and effects illustrated in the particular embodiment embodiments to one or more other additional embodiment embodiments by combining or modifying such features, structures, configurations, and effects. It should be understood that all such combinations and modifications are included within the scope of the present disclosure Although the exemplary embodiments have been described for illustrative purposes, a person skilled in the art will appreciate that various modifications and applications are possible without departing from the essential characteristics of the present disclosure. For example, the specific components of the exemplary embodiments may be variously modified. The scope of protection of the present disclosure should be construed based on the following claims, and all technical ideas within the scope of equivalents thereof should be construed as being included within the scope of the present disclosure.

What is claimed is:

1. An organic light emitting display panel comprising:
    a substrate including an active area having a plurality of subpixels, an image displayed in the active area;
    an insulating film over the substrate, the insulating film including a concave portion in the active area of a subpixel from the plurality of subpixels, the concave portion having a flat portion, an inclined portion that extends from the flat portion, and a side portion that extends from the inclined portion, the side portion farther from the substrate than the inclined portion and the flat portion;
    a first electrode disposed on the flat portion, the inclined portion, and the side portion of the concave portion of the insulating film;
    a bank on the first electrode, the bank including a first part and a second part, wherein the first part of the bank overlaps the inclined portion of the insulating film and the second part of the bank overlaps the side portion of the insulating film;
    an organic layer on the first electrode, the organic layer overlapping the concave portion of the insulating film, and
    a second electrode disposed on the organic layer and the bank,
    wherein the organic layer includes a light emitting dopant with a full width at half maximum (FWHM) of 64 nm or less reducing shifting of a color coordinate of light emitted from the organic layer to the first part of the bank from a first wavelength to a second wavelength that is greater than the first wavelength.

2. The organic light emitting display panel according to claim 1, wherein the first part of the bank is configured to absorb at least a portion of the light having the first wavelength that is emitted from the organic layer to the first part of the bank.

3. The organic light emitting display panel according to claim 1, wherein the light emitting dopant further includes at least one of a first light emitting dopant with a maximum emission wavelength of 457 nm or less, a second light emitting dopant with a full width at half maximum (FWHM) of 30 nm or less, or a third light emitting dopant with the maximum emission wavelength of 457 nm or less and the full width at half maximum of 30 nm or less.

4. The organic light emitting display panel according to claim 1, wherein the light emitting dopant further includes at least one of a first light emitting dopant with a maximum emission wavelength of 522 nm or less, a second light emitting dopant with a full width at half maximum (FWHM) of 64 nm or less, or a third light emitting dopant with the maximum emission wavelength of 522 nm or less and the full width at half maximum of 64 nm or less.

5. The organic light emitting display panel according to claim 3, the organic layer is configured to emit blue light.

6. The organic light emitting display panel according to claim 4, wherein the organic layer is configured to emit green light.

7. The organic light emitting display panel according to claim 1, wherein an area in which the bank and the first electrode are non-overlapping in the concave portion is a first light emitting area, and
    wherein an area of the first electrode that overlaps the inclined portion of the concave portion is a second light emitting area that surrounds the first light emitting area.

8. The organic light emitting display panel according to claim 7, further comprising a first non-light emitting area disposed between the first light emitting area and the second light emitting area, and a second non-light emitting area that surrounds the second light emitting area.

9. The organic light emitting display panel according to claim 8, wherein the first non-light emitting area is a portion of the first electrode on the flat portion that is overlapped by the first part of the bank.

10. The organic light emitting display panel according to claim 8, wherein the second non-light emitting area is an area of the first electrode that is overlapped by the second part of the bank.

11. The organic light emitting display panel according to claim 3, wherein at least one of the first light emitting dopant, the second light emitting dopant, or the third light emitting dopant is included in a partial area of the organic layer.

12. The organic light emitting display panel according to claim 4, wherein at least one of the first light emitting dopant, the second light emitting dopant, or the third light emitting dopant is included in a partial area of the organic layer.

13. The organic light emitting display panel according to claim 1, further comprising:
    a capping layer disposed on the second electrode.

14. The organic light emitting display panel according to claim 13, wherein the capping layer includes a first capping layer on the second electrode and a second capping layer on the first capping layer, wherein the first capping layer comprises an organic material and the second capping layer comprises an inorganic material.

15. The organic light emitting display panel according to claim 1, wherein a portion of the second electrode that overlaps the inclined portion of the concave portion is thicker than a portion of the second electrode that overlaps the flat portion of the concave portion.

16. An organic light emitting display panel comprising:
a substrate including an active area having a plurality of subpixels;
an insulating film over the substrate, the insulating film including a concave portion in the active area of a subpixel from the plurality of subpixels, the concave portion having a flat portion, an inclined portion that extends from the flat portion, and a side portion that extends from the inclined portion, the side portion farther from the substrate than the inclined portion and the flat portion;
a first electrode disposed on the flat portion, the inclined portion, and the side portion of the concave portion of the insulating film;
a bank on the first electrode, the bank including a first part and a second part, wherein the first part of the bank overlaps the inclined portion of the insulating film and the second part of the bank overlaps the side portion of the insulating film;
an organic layer on the first electrode, the organic layer overlapping the concave portion of the insulating film, and
a second electrode disposed on the organic layer and the bank,
wherein the organic layer includes a light emitting dopant with a full width at half maximum (FWHM) of 64 nm or less.

17. The organic light emitting display panel according to claim 16, wherein the first part of the bank is configured to absorb at least a portion of the light having a first wavelength that is emitted from the organic layer to the first part of the bank, and wherein the light emitting dopant included in the organic layer reduces shifting of a color coordinate of light emitted from the organic layer to the first part of the bank from the first wavelength to a second wavelength that is greater than the first wavelength.

18. The organic light emitting display panel according to claim 16, wherein a first area in which the bank and the first electrode do not overlap in the concave portion is a first light emitting area, a second area in which the first electrode that overlaps the first part of the bank is a first non-light emitting area, a third area in which the first electrode overlaps the inclined portion is a second light emitting area, and a fourth area in which the first electrode overlaps the second part of the bank is a second non-light emitting area.

19. The organic light emitting display panel according to claim 16, wherein the light emitting dopant further includes at least one of a first light emitting dopant with a maximum emission wavelength of 522 nm or less, a second light emitting dopant with a full width at half maximum (FWHM) of 64 nm or less, or a third light emitting dopant with the maximum emission wavelength of 522 nm or less and the full width at half maximum of 64 nm or less.

20. The organic light emitting display panel according to claim 19, wherein at least one of the first light emitting dopant, the second light emitting dopant, or the third light emitting dopant is included in a partial area of the organic layer.

* * * * *